US012604478B2

(12) United States Patent
Lee et al.

(10) Patent No.: US 12,604,478 B2
(45) Date of Patent: Apr. 14, 2026

(54) SEMICONDUCTOR MEMORY DEVICE AND ELECTRONIC SYSTEM INCLUDING THE SAME

(71) Applicant: Samsung Electronics Co., Ltd., Suwon-si (KR)

(72) Inventors: So Hyun Lee, Suwon-si (KR); Kang-Oh Yun, Suwon-si (KR); Dong Jin Lee, Suwon-si (KR); Jun Hee Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 388 days.

(21) Appl. No.: 18/474,307

(22) Filed: Sep. 26, 2023

(65) Prior Publication Data

US 2024/0121963 A1     Apr. 11, 2024

(30) Foreign Application Priority Data

Oct. 11, 2022    (KR) ........................ 10-2022-0129823
Mar. 7, 2023    (KR) ........................ 10-2023-0029852

(51) Int. Cl.
*H10B 43/40*        (2023.01)
*H10B 43/27*        (2023.01)

(52) U.S. Cl.
CPC ............. *H10B 43/40* (2023.02); *H10B 43/27* (2023.02)

(58) Field of Classification Search
None
See application file for complete search history.

(56) References Cited

U.S. PATENT DOCUMENTS

| | | | |
|---|---|---|---|
| 8,059,469 | B2 | 11/2011 | Lee et al. |
| 8,154,089 | B2 | 4/2012 | Ohguro |
| 8,400,812 | B2 | 3/2013 | Kutsukake et al. |
| 9,082,642 | B2 | 7/2015 | Kim et al. |
| 9,082,867 | B2 | 7/2015 | Roizin et al. |
| 10,832,776 | B2 | 11/2020 | Utsumi |
| 2014/0191290 | A1 | 7/2014 | Funao et al. |
| 2022/0059480 | A1 | 2/2022 | Park et al. |
| 2022/0122967 | A1 | 4/2022 | Kim et al. |
| 2022/0157960 | A1 | 5/2022 | Cho et al. |

FOREIGN PATENT DOCUMENTS

KR        100688563  B1      3/2007

*Primary Examiner* — Anthony Ho
(74) *Attorney, Agent, or Firm* — Wolf, Greenfield & Sacks, P.C.

(57)        ABSTRACT

A semiconductor memory device includes: a substrate including a first region and a second region, the first region includes a peripheral circuit and a first active region (FAR), and the second region includes memory cell blocks. The FAR includes a FAR first extension extending in a first direction, a FAR second extension extending in a second direction, and a FAR third extension extending in a third direction. The FAR first extension, the FAR second extension, and the FAR third extension form an angle greater than 90 degrees relative to one another. The device includes a first pass transistor circuit configured to transmit driving signals, and the first pass transistor circuit includes a FAR first gate structure on the FAR first extension, a FAR second gate structure on the FAR second extension, a FAR third gate structure on the FAR third extension, and a first shared source/drain.

20 Claims, 19 Drawing Sheets

SEMICONDUCTOR MEMORY DEVICE AND ELECTRONIC SYSTEM INCLUDING THE SAME

CROSS-REFERENCE TO RELATED APPLICATION

This application claims priority from Korean Patent Application No. 10-2022-0129823 filed on Oct. 11, 2022, and Korean Patent Application No. 10-2023-0029852 filed on Mar. 7, 2023, in the Korean Intellectual Property Office, and all the benefits accruing therefrom under 35 U.S.C. 119, the contents of which in its entirety are herein incorporated by reference.

FIELD

The present disclosure relates to a semiconductor memory device and an electronic system including the same, and more particularly, to a semiconductor memory device including pass transistors that share one source/drain region and an electronic system including the semiconductor memory device.

BACKGROUND

As information communication devices have become multifunctional, memory devices have implemented a large storage capacity and a high level of integration. As the size of memory cells decreases for a high level of integration, operating circuits and/or wiring structures included in a memory device for operation and electrical connection purposes are becoming more complex. Accordingly, there is a demand for a memory device capable of improving the level of integration and yet having excellent electrical characteristics.

To improve the degree of integration of a memory device, the number of word lines stacked vertically with respect to a substrate may increase. Accordingly, the number of pass transistors connected to the word lines may also increase, thereby causing an increase in the size of the memory device and potential deterioration of the characteristics of the memory device.

SUMMARY

Aspects of the present disclosure provide a semiconductor memory device with an improved performance and reliability.

Aspects of the present disclosure also provide an electronic system including a semiconductor memory device with an improved performance and reliability.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a semiconductor memory device includes: a substrate including a first region and a second region, wherein the first region includes a peripheral circuit and a first active region (FAR), and the second region includes memory cell blocks. The FAR includes a FAR first extension extending in a first direction, a FAR second extension extending in a second direction, and a FAR third extension extending in a third direction, and the FAR first extension, the FAR second extension, and the FAR third extension form respective angles greater than 90 degrees relative to one another. The semiconductor memory device includes first pass transistor circuit configured to transmit driving signals such that operating voltages are applied to the memory cell blocks, wherein the first pass transistor circuit includes: a FAR first gate structure on the FAR first extension, a FAR second gate structure on the FAR second extension, and a FAR third gate structure on the FAR third extension, and a first shared source/drain between the FAR first gate structure, the FAR second gate structure, and the FAR third gate structure.

In one aspect, the memory cell blocks include a first memory cell block, a second memory cell block, a third memory cell block, and wherein the first pass transistor circuit further includes a first pass transistor, a second pass transistor, and a third pass transistor configured to transmit the driving signals such that the operating voltages are applied to the first memory cell block, the second memory cell block, and the third memory cell block, respectively.

In one aspect, the first pass transistor circuit further includes a first individual source/drain on the FAR first extension, a second individual source/drain on the FAR second extension, and a third individual source/drain on the FAR third extension.

In one aspect, the FAR is Y-shaped.

In one aspect, the semiconductor memory device further includes a second active region (SAR) defined in the first region of the substrate and spaced apart from the FAR, and a second pass transistor circuit in the SAR and spaced apart from the first pass transistor circuit, wherein: the SAR includes a SAR first extension extending in the first direction, a SAR second extension extending in the second direction, and a SAR third extension extending in the third direction, the second pass transistor circuit includes a SAR first gate structure on the SAR first extension, a SAR second gate structure on the SAR second extension, and a SAR third gate structure on the SAR third extension, a second shared source/drain between the SAR first gate structure, the SAR second gate structure, and the SAR third gate structure.

In one aspect, a center of the FAR defines a recess, and one of the SAR first extension, the SAR second extension, and the SAR third extension corresponds to the recess.

In one aspect, the substrate extends in a first horizontal direction and a second horizontal direction that is orthogonal to the first horizontal direction, and the first and second shared drains are aligned in the first direction.

In one aspect, the semiconductor memory device further includes a third active region (TAR) defined in the first region of the substrate and spaced apart from the FAR and the SAR, and a third pass transistor circuit in the TAR and spaced apart from the first pass transistor circuit and the second pass transistor circuit, wherein the TAR includes a TAR first extension extending in the first direction, a TAR second extension extending in the second direction, and a TAR third extension extending in the third direction, and the third pass transistor circuit includes a TAR first gate structure on the TAR first extension, a TAR second gate structure on the TAR second extension, a TAR third gate structure on the TAR third extension, and a third shared source/drain.

In one aspect, the FAR and the SAR are in a Y shape and have a side-by-side arrangement, the FAR and the TAR are in the Y shape and have the side-by-side arrangement, and a distance between the first shared source/drain and the second shared source/drain, a distance between the second shared source/drain and the third shared source/drain, and a distance between the first shared source/drain and the third shared source/drain are equal.

In one aspect, the FAR and the SAR are in a Y shape and have an inverted arrangement, the FAR and the TAR are in the Y shape and have the inverted arrangement, and a distance between the first shared source/drain and the second shared source/drain and a distance between the first shared source/drain and the third shared source/drain are equal.

In one aspect, the semiconductor memory device includes a fourth active region (FoAR) defined in the first region of the substrate and spaced apart from the FAR, the SAR, and the TAR, and a fourth pass transistor circuit in the FoAR and spaced apart from the first pass transistor circuit, the second pass transistor circuit, and the third pass transistor circuit, wherein: the FoAR includes a FoAR first extension extending in the first direction, a FoAR second extension extending in the second direction, and a FoAR third extension extending in the third direction, and the fourth pass transistor circuit includes a FoAR first gate structure on the FoAR first extension, a FoAR second gate structure on the FoAR second extension, and a FoAR third gate structure on the FoAR third extension, and a fourth shared source/drain.

In one aspect, the FAR and the SAR are in a Y shape and have a side-by-side arrangement, the FAR and the FoAR are in the Y shape and have the side-by-side arrangement, a first distance between the first shared source/drain and the second shared source/drain and a second distance between the first shared source/drain and the fourth shared source/drain are equal, and a third distance between the first shared source/drain and the third shared source/drain is different from the first distance or the second distance.

In one aspect, the FAR and the SAR are in a Y shape and have an inverted arrangement, the TAR and the FoAR are in the Y shape and have the inverted arrangement, the SAR and the TAR are in the Y shape and have a side-by-side arrangement, the FAR and the FoAR are in the Y shape and have the side-by-side arrangement, and a distance between the first shared source/drain and the second shared source/drain, a distance between the second shared source/drain and the third shared source/drain, a distance between the third shared source/drain and the fourth shared source/drain, and a distance between the first shared source/drain and the fourth shared source/drain are equal.

According to another aspect of the present disclosure, a semiconductor memory device includes: a first substrate including a first surface that extends in a first horizontal direction and a second horizontal direction that is orthogonal to the first horizontal direction, and a memory cell region on the first surface; and a second substrate including a second surface that is below the first substrate, a first peripheral circuit region on the second surface and configured to receive a block selection signal and to transmit a driving signal to the memory cell region, wherein the first peripheral circuit region includes a first active region, the first active region including a first gate structure extending in a first direction, a second gate structure extending in a second direction, a third gate structure extending in a third direction, and a first shared drain between the first gate structure, the second gate structure, and the third gate structure, and wherein the first direction, the second direction, and the third direction are not parallel to one another and are spaced apart from one another.

In one aspect, the first active region includes a first extension, a second extension, and a third extension that form an angle of 120 degrees relative to one another. In one aspect, the first peripheral circuit region and the memory cell region are connected by bonding first bonding pads on the first substrate and second bonding pads on the second substrate, and wherein the first surface of the first substrate and the second surface of the second substrate face each other.

In one aspect, the memory cell region includes gate electrode layers that extend in the first horizontal direction and are stacked in a vertical direction, and the memory cell region includes channel structures that extend in the vertical direction and penetrate the gate electrode layers, and each of the channel structures includes an information storage film, a semiconductor pattern, and a variable resistance film that are sequentially stacked on sidewalls of channel holes that penetrate the gate electrode layers.

In one aspect, a second peripheral circuit region is on the second substrate and is spaced apart from the first peripheral circuit region, the second peripheral circuit region includes a second active region, the second active region including a fourth gate structure extending in the first direction, a fifth gate structure extending in the second direction, and a sixth gate structure extending in the third direction, the fourth gate structure, the fifth gate structure, and the sixth gate structure spaced apart from one another, a second shared drain between the fourth gate structure, the fifth gate structure, and the sixth gate structure, and the first and second shared drains are aligned in the first direction. In one aspect, the first active region and the second active region are in a Y shape and have a side-by-side arrangement.

According to another aspect of the present disclosure, an electronic system includes: a main substrate; a semiconductor memory device on the main substrate, the semiconductor memory device including a first substrate that includes a peripheral circuit and a second substrate that includes memory cells; a controller on the main substrate, the controller being electrically connected to the semiconductor memory device, wherein: the semiconductor memory device includes an active region that is defined on the first substrate, the active region includes a first extension extending in a first direction, a second extension extending in a second direction, and a third extension extending in a third direction, the first extension, the second extension, and the third extension forming respective angles greater than 90 degrees relative to one another, the active region includes a pass transistor circuit configured to transmit driving signals such that operating voltages are applied to the memory cells; and the pass transistor circuit includes a first gate structure on the first extension, a second gate structure on the second extension, a third gate structure on the third extension, and a shared source/drain between the first gate structure, the second gate structure, and the third gate structure.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which:

FIG. 3 is a schematic view of a memory cell array according to some embodiments of the present disclosure;

FIG. 6 is a layout view illustrating pass transistors and memory cell blocks of a semiconductor memory device according to some embodiments of the present disclosure;

FIG. 7 is an enlarged layout view of a pass transistor of FIG. 6;

FIG. 19 is a cross-sectional view taken along line I-I of FIG. 18.

DETAILED DESCRIPTION

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

In addition, unless explicitly described to the contrary, the word "comprises", and variations such as "comprises" or "comprising", will be understood to imply the inclusion of stated elements but not the exclusion of any other elements.

As used herein, the phrase "at least one of A, B, and C" refers to a logical (A OR B OR C) using a non-exclusive logical OR, and should not be construed to mean "at least one of A, at least one of B and at least one of C."

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concept.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof. The term "and/or" includes any and all combinations of one or more of the associated listed items."

A semiconductor memory device according to some embodiments of the present disclosure will hereinafter be described with reference to FIGS. 1 through 8.

Figure 1:
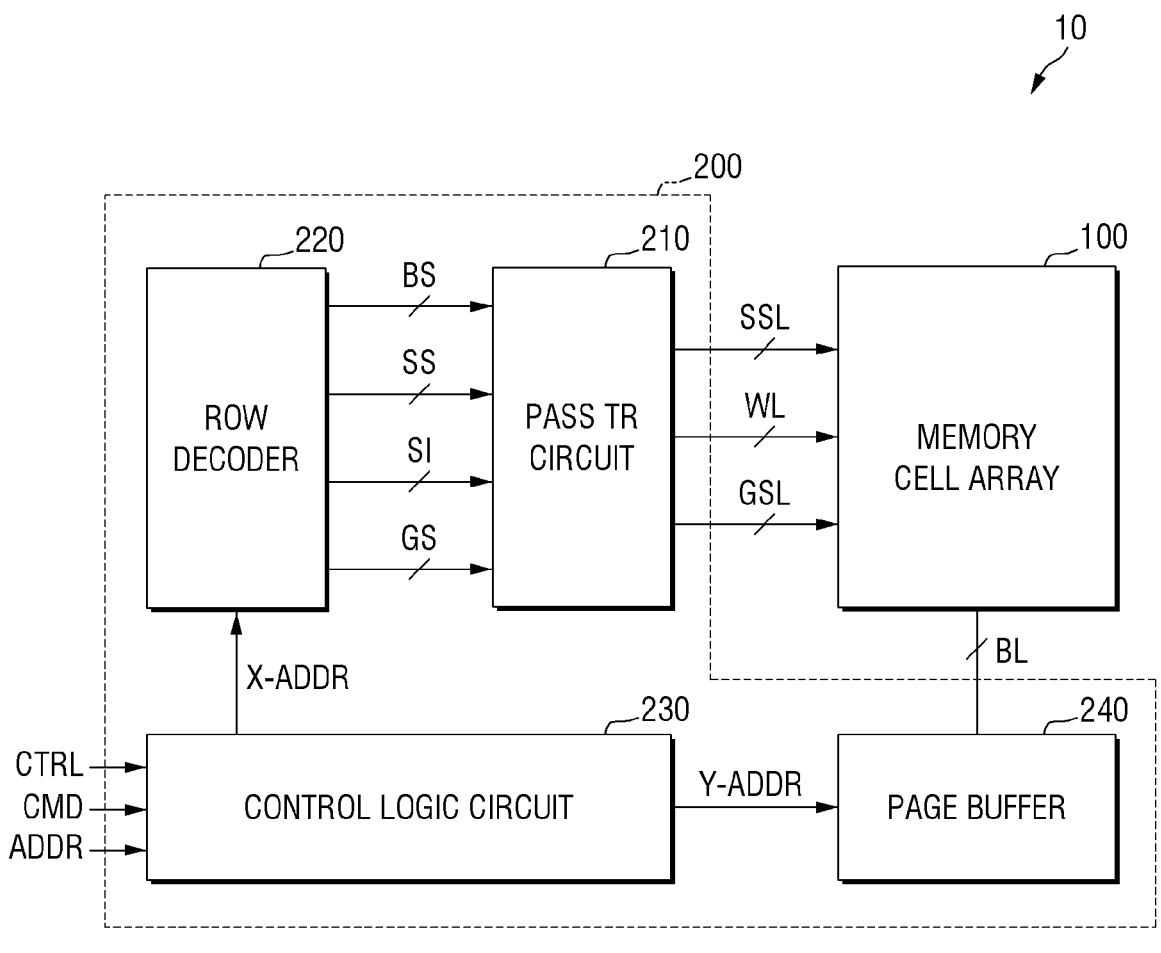
FIG. 1 is a block diagram of a semiconductor memory device according to some embodiments of the present disclosure.

FIG. 1 is a block diagram of a semiconductor memory device according to some embodiments of the present disclosure.

Referring to FIG. 1, a semiconductor memory device 10 may include a memory cell array 100 and a peripheral circuit 200. The peripheral circuit 200 may include a pass transistor circuit 210, a row decoder 220, a control logic circuit 230, and a page buffer 240. Although not specifically illustrated, the peripheral circuit 200 may further include a voltage generator, a data input/output circuit, an input/out interface, a temperature sensor, a command decoder, or an address decoder. In some embodiments, the semiconductor memory device 10 may be a nonvolatile memory device.

The memory cell array 100 may be connected to the pass transistor circuit 210 through wordlines (WL), string selection lines (SSL), and ground selection lines (GSL) and may be connected to the page buffer 240 through bitlines (BL). The memory cell array 100 may include a plurality of memory cells such as, for example, NAND flash memory cells, but the present disclosure is not limited thereto. Alternatively, in some embodiments, the memory cells may be resistive memory cells, such as resistive random-access memory (ReRAM), phase-change random-access memory (PRAM), or magnetic random-access memory (MRAM) cells.

In some embodiments, the memory cell array 100 may include a three-dimensional (3D) memory cell array that may include a plurality of NAND strings, and each of the NAND strings may include memory cells connected to wordlines that are stacked vertically on a substrate. However, the present disclosure is not limited to this arrangement. Alternatively, in some embodiments, the memory cell array 100 may include a two-dimensional (2D) memory cell array, in which case, the 2D memory cell array may include a plurality of NAND strings arranged in row and column directions.

The control logic circuit 230 may generate various control signals for programming data to, reading data from, or erasing data from, the memory cell array 100 based on commands (CMD), addresses (ADDR), and control signals (CTRL). For example, the control logic circuit 230 may output a row address (X-ADDR) and a column address (Y-ADDR). In this manner, the control logic circuit 230 may generally control various operations performed in the semiconductor memory device 10.

The row decoder 220 may output a block selection signal for selecting one of a plurality of memory blocks to block selection signal lines BS in response to receiving the row address X-ADDR. Also, the row decoder 220 may output a wordline driving signal for selecting one of the wordlines WL of a selected memory block to wordline driving signal lines SI, output a string selection line driving signal for selecting one of the string selection lines SSL to string selection line driving signal lines SS, and output a ground selection line driving signal for selecting one of the ground selection lines GSL to ground selection line driving signal lines (GS) in response to receiving the row address X-ADDR.

The page buffer 240 may select some of the bitlines BL in response to the column address Y-ADDR. Specifically, the page buffer 240 may operate as a write driver or a sense amplifier.

Figure 4:
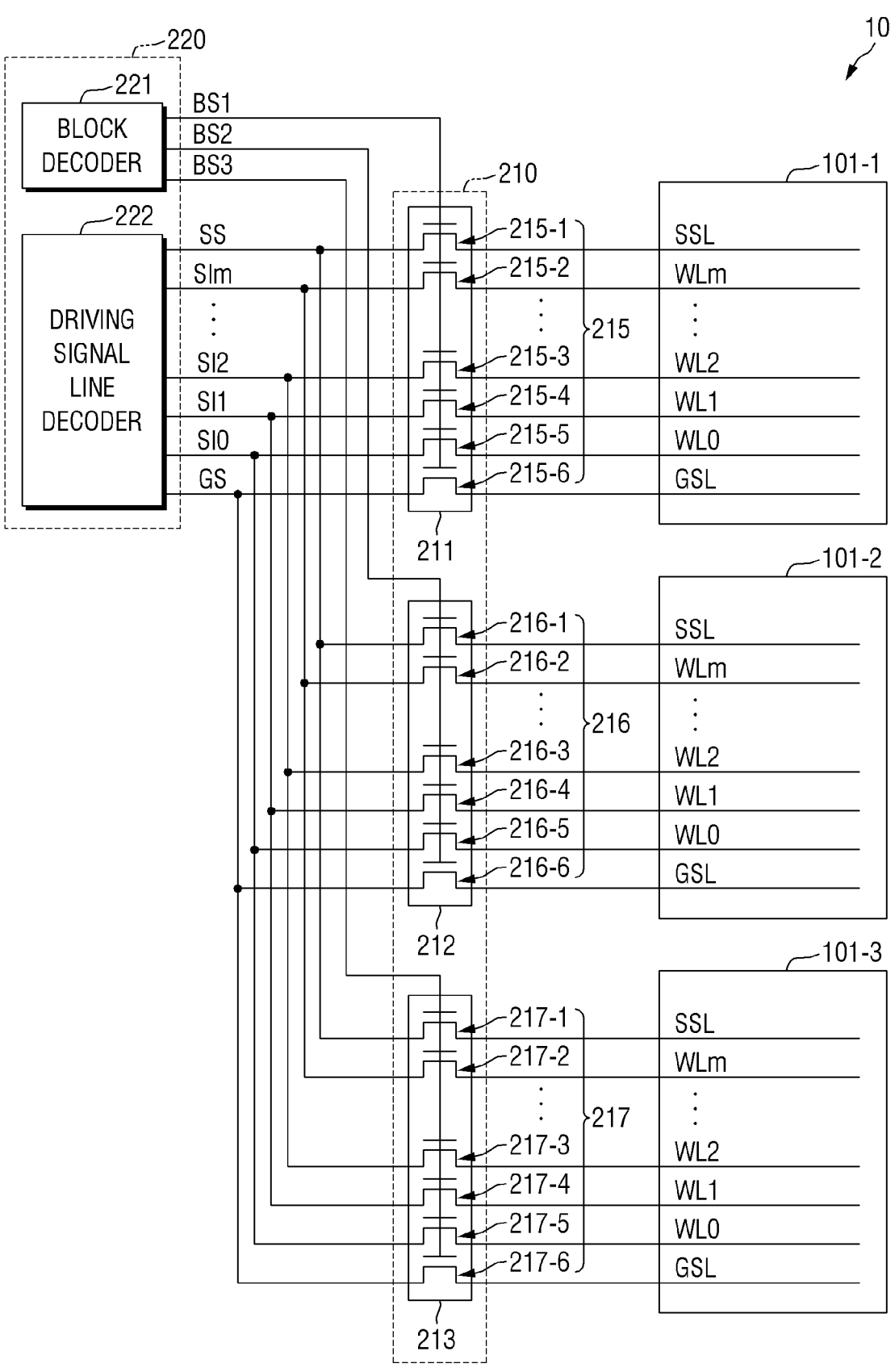
FIG. 4 illustrates a row decoder, pass transistors, and memory cell blocks according to some embodiments of the present disclosure.

The pass transistor circuit 210 may be connected to the row decoder 220 through the block selection signal lines BS, the string selection line driving signal lines SS, the wordline driving signal lines SI, and the ground selection line driving signal lines GS. The string selection line driving signal lines SS, the wordline driving signal lines SI, and the ground selection line driving signal lines GS may all be referred to as driving signal lines. With reference to FIGS. 1 and 4, the pass transistor circuit 210 may include a plurality of pass transistors 215-1, 215-2, 215-3, 215-4, 215-5, 215-6 (collectively referred to as pass transistors 215), 216-1, 216-2, 216-3, 216-4, 216-5, 216-6 (collectively referred to as pass transistors 216), and 217-1, 217-2, 217-3, 217-4, 217-5, 217-6 (collectively referred to as pass transistors 217). The pass transistors 215, 216, 217 may be controlled by block selection signals received via the block selection signal lines BS and may provide string selection line driving signals, wordline driving signals, and ground selection line driving signals to the string selection lines SSL, the wordlines WL, and the ground selection lines GSL, respectively. FIG. 4 illustrates that the number of pass transistors included in one pass transistor group is six, but the present disclosure is not limited thereto.

The pass transistor circuit 210 may include a plurality of pass transistors groups corresponding to a plurality of memory cell blocks that are adjacent to one another. For example, referring to FIG. 4, the pass transistor circuit 210 may include three pass transistor groups, i.e., first, second, and third pass transistor groups 211, 212, and 213 corresponding to first, second, and third memory cell blocks 101-1, 101-2, and 101-3, respectively, which are adjacent to one another.

As the number of layers of memory cells in the memory cell array 100, i.e., the number of wordlines (WL) stacked vertically, increases due to developments in semiconductor processes, the number of pass transistors for driving the wordlines (WL) increases, and the area occupied by the pass transistor circuit 210 increases accordingly. In some embodiments, the peripheral circuit 200 may be vertically above or below the memory cell array 100. Thus, as the area in which the pass transistor circuit 210 overlaps vertically with the wordlines WL, the chip size of the semiconductor memory device 10 does not increase when the number of pass transistors increases. This will hereinafter be described with reference to FIG. 2.

Figure 2:
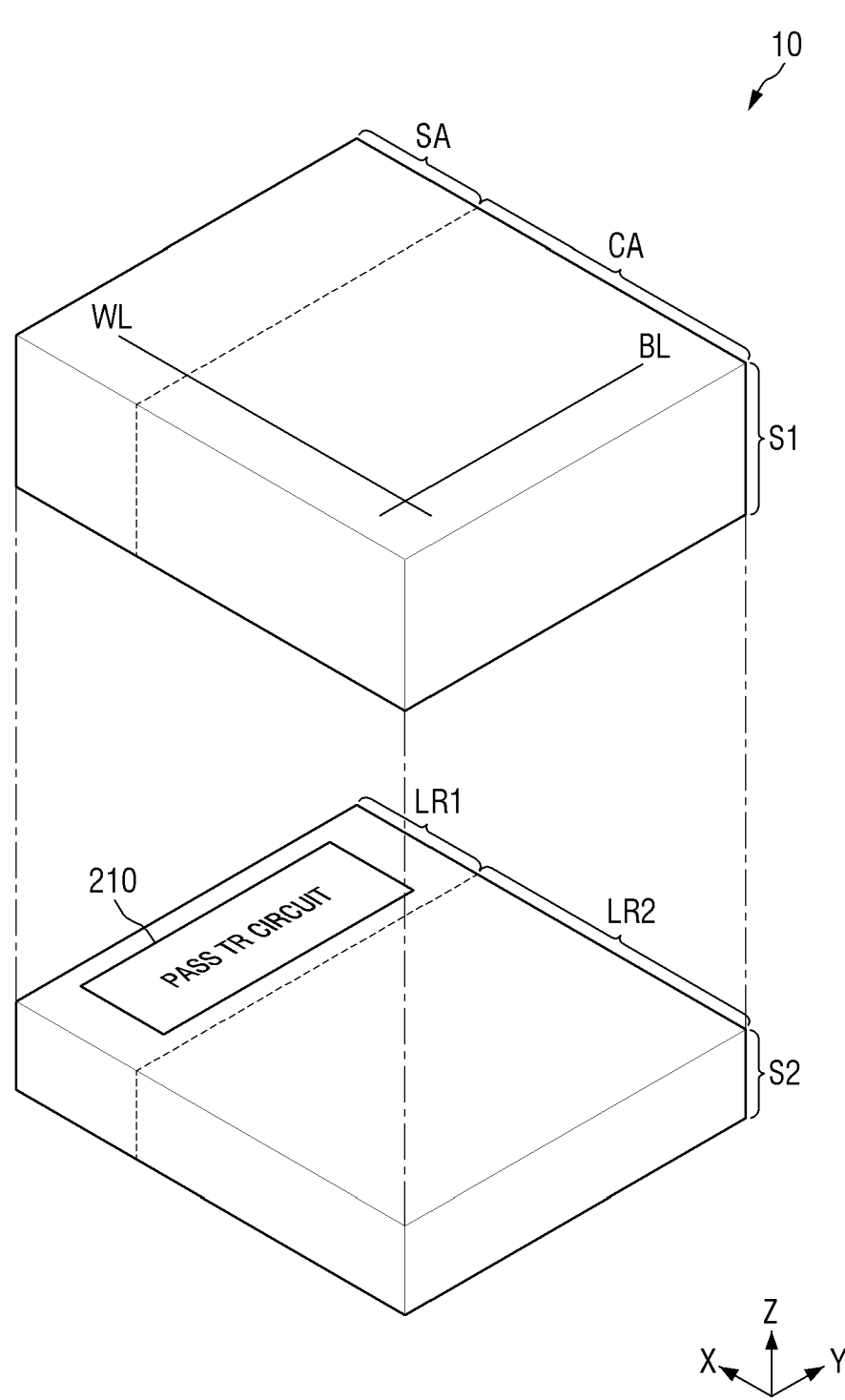
FIG. 2 is a schematic view of the semiconductor memory device of FIG. 1.

FIG. 2 is a schematic view of the semiconductor memory device of FIG. 1.

Referring to FIGS. 1 and 2, the semiconductor memory device 10 may include first and second semiconductor layers S1 and S2, and the first semiconductor layer S1 may be stacked in a vertical direction Z with respect to the second semiconductor layer S2. Specifically, the second semiconductor layer S2 may be below the first semiconductor layer S1 in the vertical direction Z. In some embodiments, the memory cell array 100 may be formed in the first semiconductor layer S1, and the peripheral circuit 200 may be formed in the second semiconductor layer S2. Accordingly, the semiconductor memory device 10 may have a structure in which the memory cell array 100 is above the peripheral circuit 200, i.e., a cell-over-periphery (COP) structure.

The first semiconductor layer S1 may include a cell area CA and a stair area SA, and a plurality of memory cells may be in the cell area CA. In the first semiconductor layer S1, a plurality of wordlines WL may extend in a first horizontal direction X, and a plurality of bitlines BL may extend in a second horizontal direction Y. End portions of the wordlines WL may form a staircase shape. In some embodiments, part of the first semiconductor layer S1, including the end portions of the wordlines WL that form a staircase shape, may be referred to as the stair area SA or a wordline extension area.

The second semiconductor layer S2 may include a substrate, and the peripheral circuit 200 may be formed in the second semiconductor layer S2 by forming semiconductor elements and devices such as transistors on the substrate. After the formation of the peripheral circuit 200 in the second semiconductor layer S2, the first semiconductor layer S1, which includes the memory cell array 100, may be formed, and patterns for electrically connecting the wordlines WL and the bitlines BL of the memory cell array 100 and the peripheral circuit 200, which is formed in the second semiconductor layer S2, may be formed. The second semiconductor layer S2 may include a first logic region LR1, which corresponds to the stair area SA, and a second logic region LR2, which corresponds to the cell area CA. In some embodiments, the pass transistor circuit 210 may be in the first logic region LR1, but the present disclosure is not limited thereto.

As already mentioned above, in some embodiments, the semiconductor memory device 10 may have a COP structure, and the pass transistor circuit 210 may be below the stair area SA. In this case, pass transistors included in different memory cell blocks and connected to wordlines on the same level may be adjacent to one another. However, the present disclosure is not limited to this arrangement. Alternatively, the semiconductor memory device 10 may have a shape other than the COP structure, and as such, the pass transistor circuit 210 may be horizontally adjacent to the memory cell array 100.

Figure 3:
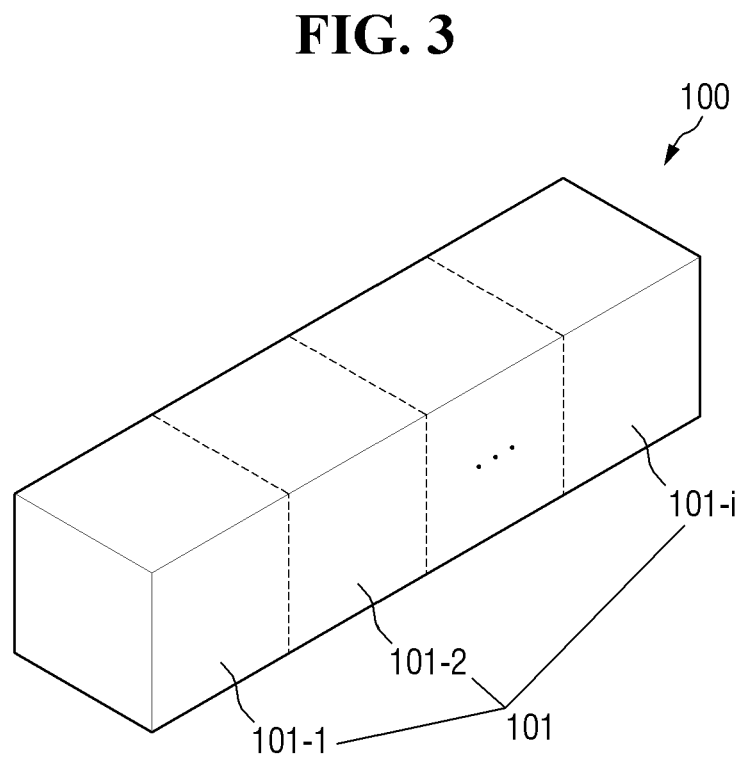

FIG. 3 is a schematic view of a memory cell array according to some embodiments of the present disclosure.

Referring to FIG. 3, the memory cell array 100 may include 101-1a first memory cell block 101-1, a second memory cell bock 101-2, . . . and memory cell block 101-i (where i is a positive integer). The first memory cell block 101-1, the second memory cell bock 101-2, and the memory cell block 101-i are collectively referred to as "memory cell blocks 101." The memory cell blocks 101 may have a 3D structure or a vertical structure. Specifically, each of the memory cell blocks 101 may include a plurality of NAND strings extending in the vertical direction Z. The NAND strings may be spaced apart from one another by a predetermined distance in the first and second horizontal directions X and Y. The memory cell blocks 101 may be selected by the row decoder 220 of FIG. 1. For example, the row decoder 220 may select a memory cell block corresponding to a predetermined block address from among the memory cell blocks 101.

FIG. 4 illustrates a row decoder, pass transistors, and memory cell blocks according to some embodiments of the present disclosure.

Referring to FIG. 4, the semiconductor memory device 10 may include the pass transistor circuit 210, which includes a plurality of pass transistor groups 211, 212, 213 corresponding to a plurality of memory cell blocks 101-1, 101-2, 101-3, respectively. Each of the first, second, and third memory cell blocks 101-1, 101-2, 101-3 may include a ground selection line GSL, a plurality of wordlines WL0, WL1, WL2, WLm, (where m is a positive integer, and where the wordlines are collectively referred to as wordlines WL), and a string selection line SSL.

The row decoder 220 may include a block decoder 221 and a driving signal line decoder 222. The first pass transistor group 211 may include the first pass transistors 215, the second pass transistor group 212 may include the second pass transistors 216, and the third pass transistor group 213 may include the third pass transistors 217.

The block decoder 221 may be connected to the first pass transistor group 211 through a first block selection signal line BS1, the second pass transistor group 212 through a second block selection signal line BS2, and the third pass transistor group 213 through a third block selection signal line BS3.

The first block selection signal line BS1 may be connected to the gates of the first pass transistors 215. For example, in response to the activation of a first block selection signal provided through the first block selection signal line BS1, the first pass transistors 215 may be turned on, and as a result, the first memory cell block 101-1 may be selected.

The second block selection signal line BS2 may be connected to the gates of the second pass transistors 216. For example, in response to the activation of a second block selection signal provided through the second block selection signal line BS2, the second pass transistors 216 may be turned on, and as a result, the second memory cell block 101-2 may be selected.

The third block selection signal line BS3 may be connected to the gates of the third pass transistors 217. For example, in response to the activation of a third block selection signal provided through the third block selection signal line BS3, the third pass transistors 217 may be turned on, and as a result, the third memory cell block 101-3101-3 may be selected.

The driving signal line decoder 222 may be connected to the first, second, and third pass transistor groups 211, 212, and 213 through a string selection line driving signal line SS, wordline driving signal lines SI0, SI1, S12, SIm, collectively referred to as lines SI), and a ground selection line driving signal line GS. Specifically, the string selection line driving signal line SS, the wordline driving signal lines SI, and the ground selection line driving signal line GS may be connected to the drains of the first pass transistors 215, the drains of the second pass transistors 216, and the drains of the third pass transistors 217.

The first pass transistor group 211 may be connected to the first memory cell block 101-1 through the ground selection line GSL, the wordlines WL, and the string selection line SSL of the first memory cell block 101-1. The first pass transistor 215-1 of the first pass transistor group 211 may be connected between the string selection line driving signal line SS and the string selection line SSL of the first memory cell block 101-1. The second through fifth pass transistors 215-2 through 215-5 of the first pass transistor group 211 may be connected between the wordline driving signal lines SI and the wordlines WL of the first memory cell block 101-1. The sixth pass transistor 215-6 of the first pass transistor group 211 may be connected between the ground selection line driving signal line GS and the ground selection line GSL of the first memory cell block 101-1.

For example, in response to the first block selection signal being activated, the first pass transistors 215 of the first pass transistor group 211 may provide driving signals provided thereto through the ground selection line driving signal line GS, the wordline driving signal SI; and the string selection line driving signal line SS to the ground selection line GSL, the wordlines WL, and the string selection line SSL of the first memory cell block 101-1. The above description of the first pass transistor group 211 may also be applicable to the second and third pass transistor groups 212 and 213, and thus, detailed descriptions of the second and third pass transistor groups 212 and 213 will be omitted.

Figure 5:
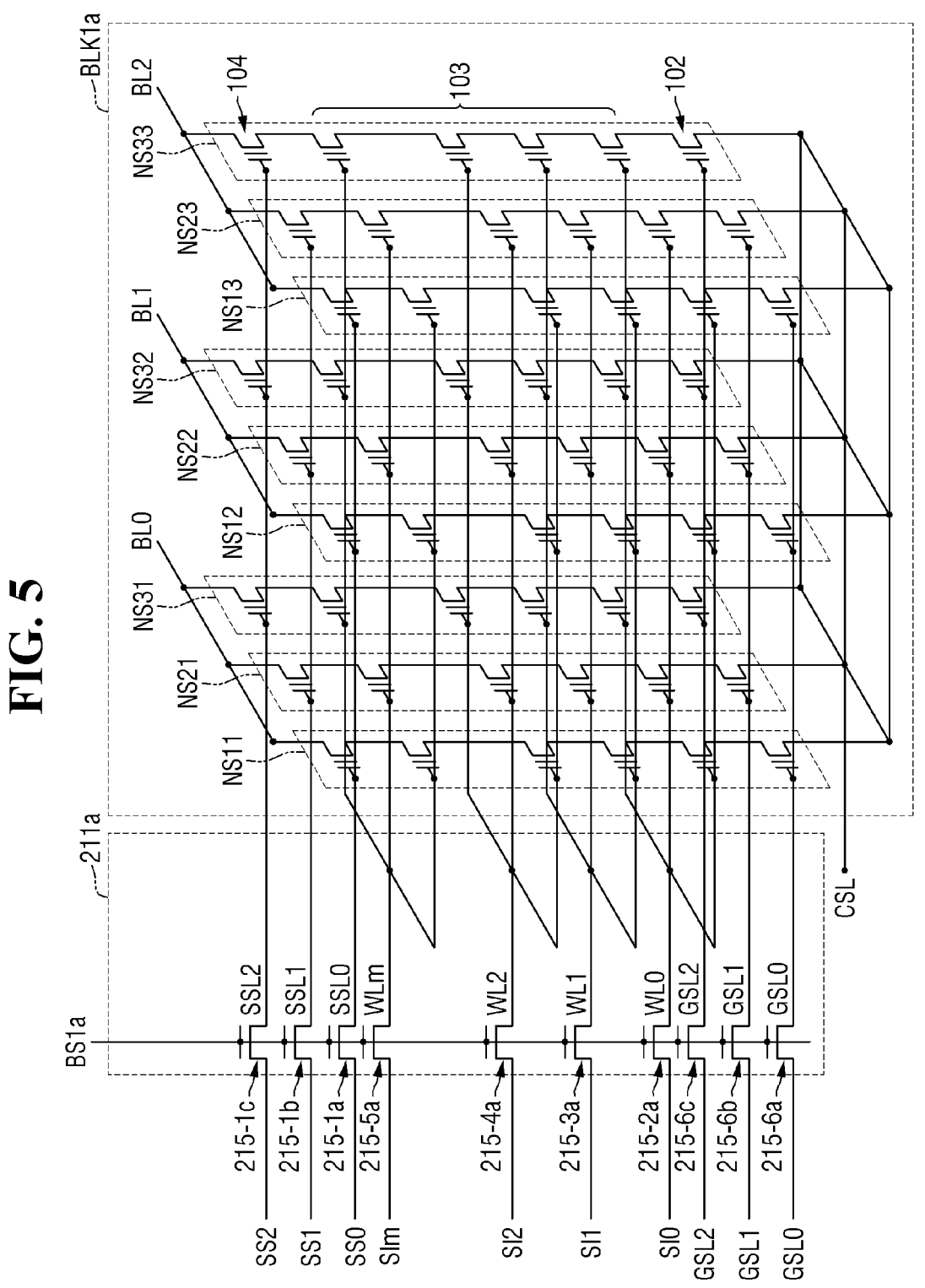
FIG. 5 is a circuit diagram illustrating pass transistors and memory cell blocks according to some embodiments of the present disclosure.

FIG. 5 is a circuit diagram illustrating pass transistors and memory cell blocks according to some embodiments of the present disclosure.

Referring to FIG. 5, a transistor group 211*a* may correspond to any one of the first, second, and third pass transistor groups 211, 212, and 213. In some embodiments, a memory cell block 101-1*a* may correspond to any one of the first, second, and third memory cell blocks 101-1, 101-2, and 101-3.

The memory cell block 101-1*a* may include a plurality of NAND strings NS11, NS21, NS31, NS12, NS22, NS32, NS13, NS23, NS33, a plurality of wordlines WL0, WL1, WL2, . . . WLm, a plurality of bitlines BL0, BL1, BL2, a plurality of ground selection lines GSL0, GSL1, and GSL2, a plurality of string selection lines SSL0, SSL1, and SSL2, and a common source line CSL. The numbers of NAND strings, wordlines, bitlines, ground selection lines, and string selection lines included in the memory cell block 101-1*a* may vary in other embodiments and is not limited to the numbers described herein.

The NAND strings NS11, NS21, and NS31 may be provided between the bitline BL0 and the common source line CSL, the NAND strings NS12, NS22, and NS32 may be provided between the bitline BL1 and the common source line CSL, and the NAND strings NS13, NS23, and NS33 may be provided between the bitline BL2 and the common source line CSL. Each of the NAND strings NS11 through NS33 may include a string selection transistor 102, a plurality of memory cells 103, and a ground selection transistor 104, which are connected in series.

The string selection transistor 102 may be connected to one of the string selection lines SSL0 through SSL2. The memory cells 103 may be connected to their respective wordlines WL0 through WLm. The ground selection transistor 104 may correspond to one of the ground selection lines GSL0 through GSL2. The string selection transistor 102 may be connected to one of the bitlines BL0 through BL2, and the ground selection transistor GST may be connected to the common source line CSL.

The pass transistor group 211*a* may include pass transistors 215-6*a*, 215-6*b*, 215-6*c*, which are connected to the ground selection lines GSL0 through GSL2, respectively. The pass transistor group 211*a* may include pass transistors 215-2*a*, 215-3*a*, 215-4*a*, 215-5*a*, which are connected to the wordlines WL0 through WLm, respectively, and pass transistors 215-1*a*, 215-1*b*, 215-1*c*, which are connected to the string selection lines SSL0 through SSL2, respectively. The pass transistors 215*a* may be turned on by a block selection signal provided thereto through a block selection signal line BS1*a* and may provide driving signals provided thereto through string selection line driving signal lines SS0 through SS2, wordline driving signal lines SI0 through SIm; and ground selection line driving signals GS0 through GS2 to the string selection lines SSL0 through SSL2, the wordlines (WL), and the ground selection lines GSL0 through GSL2.

Figure 6:
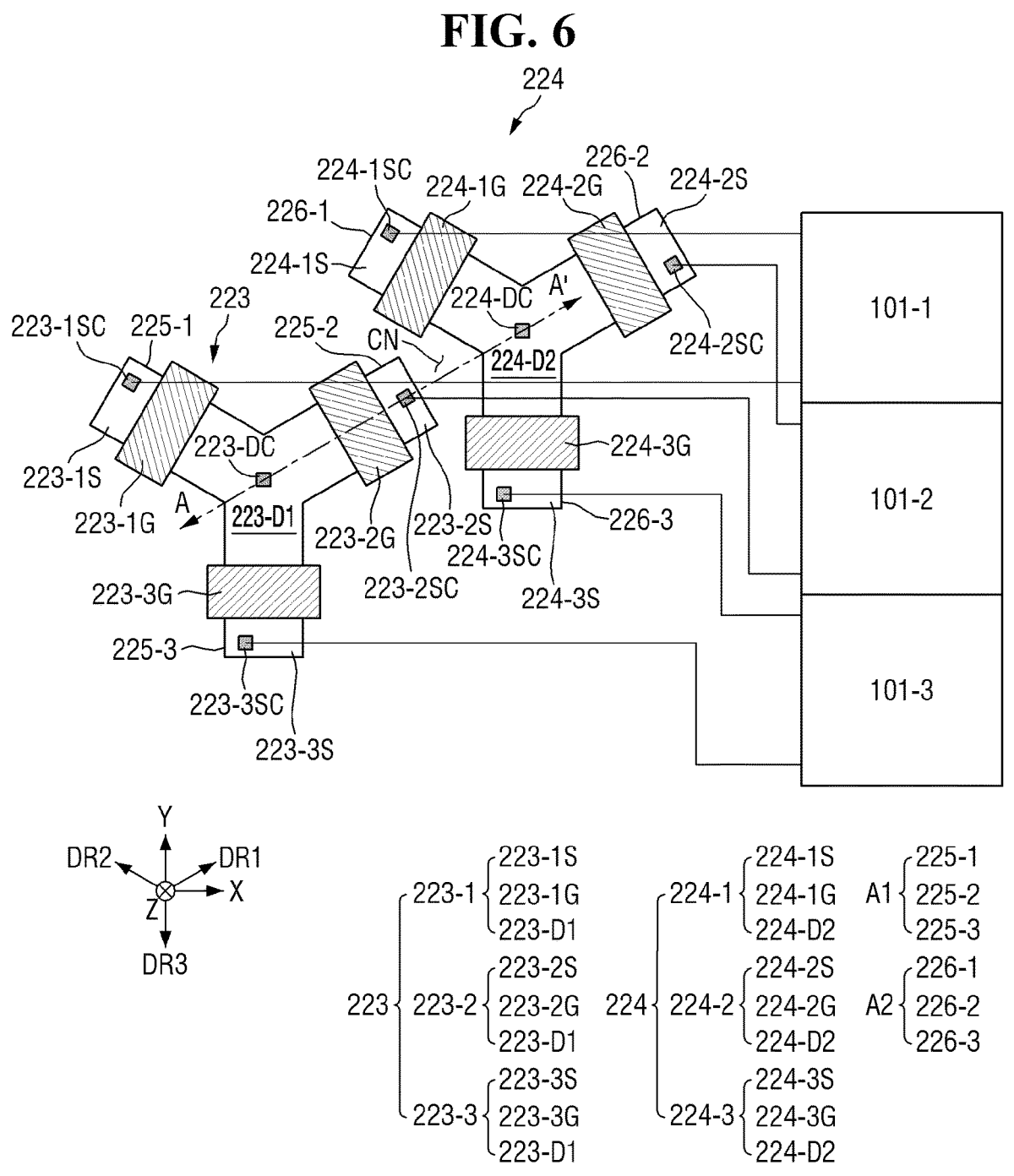
Figure 7:
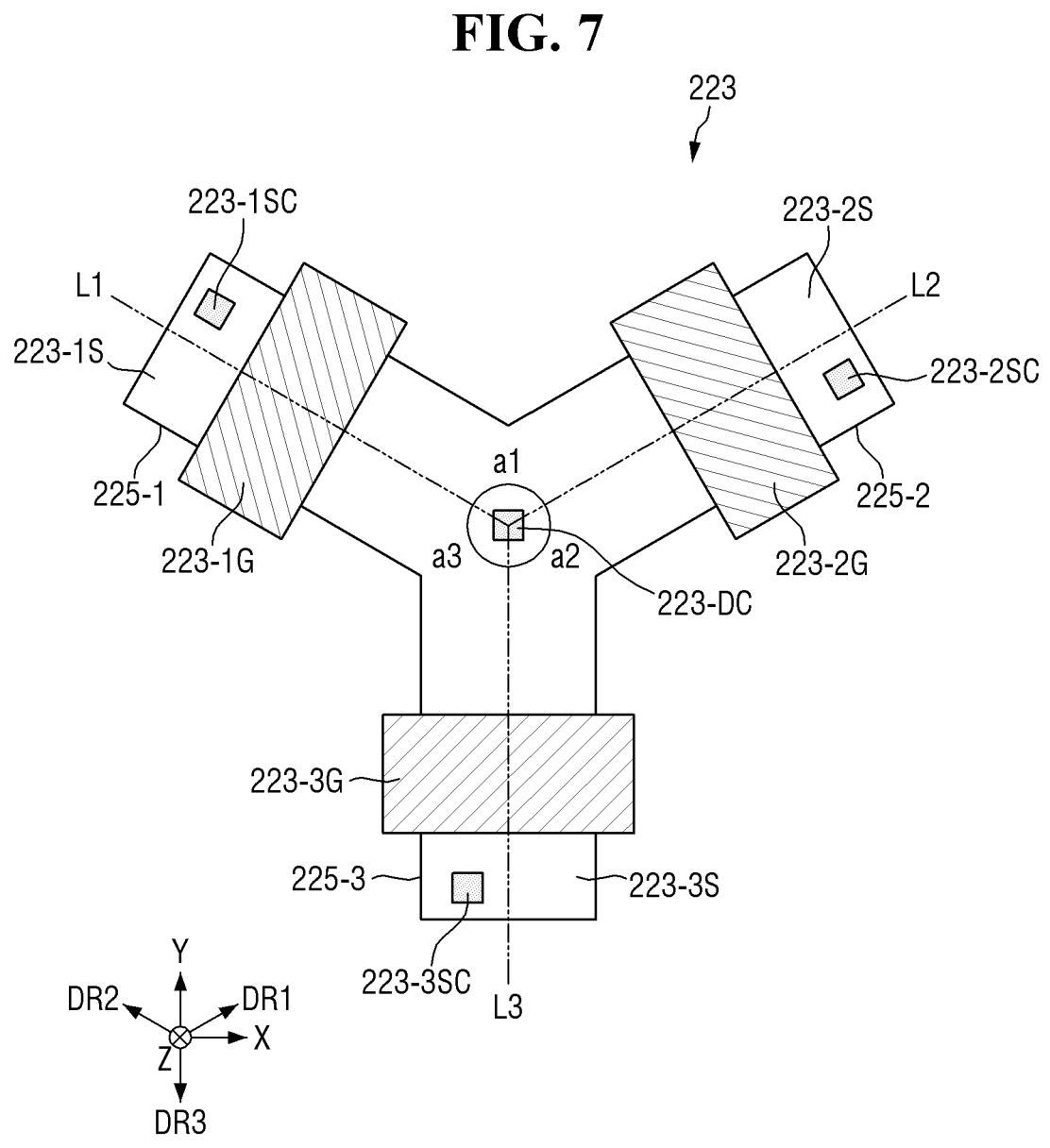
Figure 8:
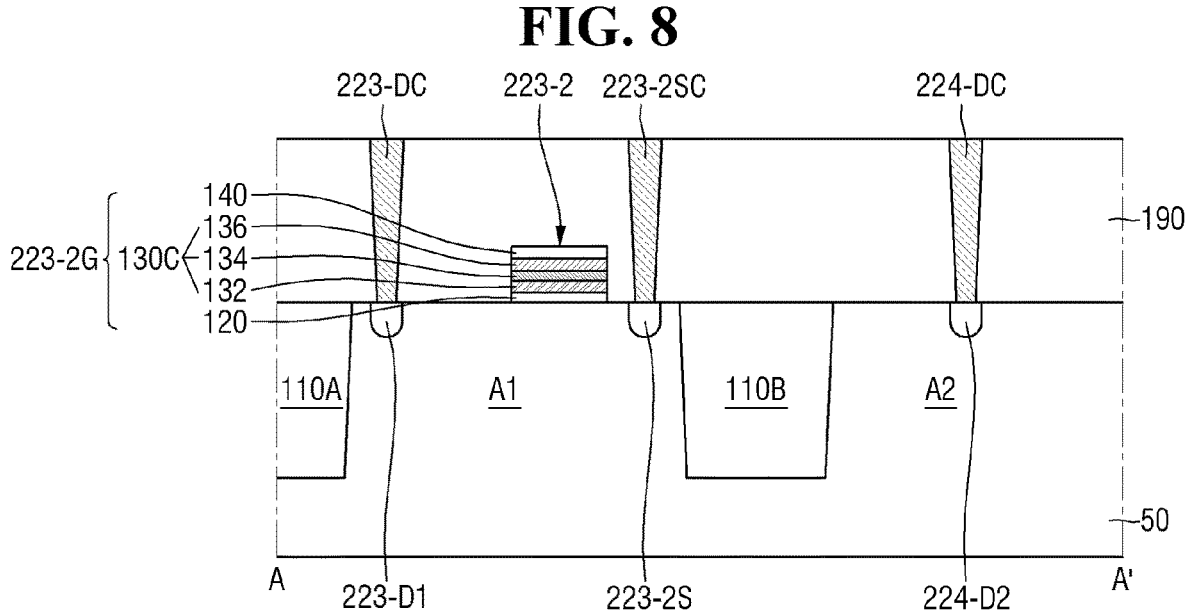
FIG. 8 is a cross-sectional view taken along line A-A' of FIG. 6.

FIG. 6 is a layout view illustrating pass transistors and memory cell blocks of a semiconductor memory device according to some embodiments of the present disclosure. FIG. 7 is an enlarged layout view of a pass transistor of FIG. 6. FIG. 8 is a cross-sectional view taken along line A-A' of FIG. 6.

Referring to FIGS. 6 through 8, the semiconductor memory device according to some embodiments of the present disclosure may include a first substrate 50, a first active region A1, a first pass transistor circuit 223, gate structures 223-1G, 223-2G, and 223-3G, individual sources/drains 223-1S, 223-2S, and 223-3S, a first shared source/drain 223-D1, individual source/drain contacts 223-1SC, 223-2SC, and 223-3SC, and a first shared source/drain contact 223-DC. The semiconductor memory device may also include a second active region A2, a second pass transistor circuit 224, gate structures 224-1G, 224-2G, 224-3G individual sources/drains 224-1S, 224-2S, 224-3S, a second shared source/drain 224-D2, individual source/drain contacts 224-1SC, 224-2SC, and 224-3SC, 224-1SC, 224-2SC, 224-3SC, and a second shared source/drain contact 224-DC.

In some embodiments, the first and second shared source/drains 223-DC, 224-DC may also be referred to as the first and second shared drains 223-DC and 224-DC respectively, the individual sources/drains 223-1S, 223-2S, 223-35 may also be referred to as the individual sources 223-1S, 223-2S, 223-3S, and the individual sources/drains 224-1S, 224-2S, 224-35 may also be referred to as the individual sources 224-1S, 224-2S, 224-35.

The first substrate 50 may include a base substrate and an epitaxial layer grown on the base substrate, but the present disclosure is not limited thereto. Alternatively, the first substrate 50 may include only the base substrate. The first substrate 50 may be a silicon substrate, a gallium arsenide substrate, a silicon germanium substrate, a ceramic substrate, a quartz substrate, a glass substrate for a display, or a semiconductor on insulator (SOI) substrate. The first substrate 50 will hereinafter be described as being, for example, a silicon substrate.

In some embodiments, the first substrate 50 may be doped with a dopant of a first conductivity type. For example, when the first and second pass transistors 223 and 224 are n-type transistors, the first substrate 50 may include p-type impurities. Although not specifically shown, the first substrate 50 may include a well doped with a dopant of the first conductivity type.

Referring to FIGS. 6 and 8, device isolation films 110A and 110B may define a plurality of active regions, i.e., the first and second active regions A1 and A2, in the first substrate 50. For example, device isolation trenches, which define the first and second active regions A1 and A2, may be formed in the first substrate 50. The device isolation films 110A and 110B may fill the device isolation trenches. The device isolation films 110A and 110B may surround the first and second active regions A1 and A2, respectively. The first and second active regions A1 and A2 may be separated from each other by the device isolation films 110A and 110B.

The sides of each of the device isolation trenches are illustrated as being inclined due to the characteristics of a process for forming the device isolation trenches, but the present disclosure is not limited thereto.

The device isolation films 110A and 110B may include at least one of, for example, silicon oxide, silicon oxynitride, and silicon nitride, but the present disclosure is not limited thereto.

The first active region A1 may include extensions 225-1, 225-2, 225-3.

The extensions 225-1, 225-2, 225-3 may extend in second, first, and third directions DR2, DR1, and DR3, respectively, and the directions may differ from one another. The first, second, and third directions DR1, DR2, and DR3 may differ from the first and second horizontal directions X and Y, in which the substrate 50 extends. For example, the first and second directions DR1 and DR2 may be diagonal with respect to the first and second horizontal directions X and Y, and the third direction DR3 may be parallel to the second horizontal direction Y, but may be opposite to the second horizontal direction Y.

The extensions 225-1, 225-2, 225-3 may form a Y shape together. The extensions 225-1, 225-2, 225-3 may form an angle greater than 90 degrees relative to one another. In this case, the angles between extensions 225-1, 225-2, 225-3 may be defined as the angles between first, second, and third imaginary lines ("L1," "L2," and "L3" of FIG. 7), which are parallel to the second, first, and third directions DR2, DR1, and DR3, respectively.

For example, referring to FIG. 7, the angles include an angle a1 formed by the first imaginary line L1, which is parallel to the direction in which the extension 225-1 extends, and the second imaginary line L2, which is parallel to the direction in which the extension 225-2 extends. Furthermore, the angles include an angle a2 formed by the second imaginary line L2 and the third imaginary line L3, which is parallel to the direction in which the extension 225-3 extends, and an angle a3 formed by the first and third imaginary lines L1 and L3. In one embodiments, the angles a1, a2, a3 may each be 120 degrees, but the present disclosure is not limited thereto.

The second active region A2 may include extensions 226-1, 226-2, 226-3. The second active region A2 may be spaced apart from the first active region A1.

The above description of the shape of the extensions 225 may also be applicable to the extensions 226.

Referring to FIG. 6, a recess CN may be formed in a Y shape in the middle of the second active region A2, adjacent to the second shared source/drain 224-D2. The recess CN may correspond to one of the extensions 225 of the first active region A1.

Referring to FIGS. 6 and 7, the first and second shared source/drains 223-D1 and 224-D2 of the first and second active regions A1 and A2, respectively, may be positioned on the second imaginary line L2, which extends in the first direction DR1.

The first and second pass transistor circuits 223 and 224 may be in the first and second active regions A1 and A2. The first pass transistor circuit 223 may be in the first active region A1, and the second pass transistor circuit 224 may be in the second active region A2.

The first pass transistor circuit 223 may include pass transistors 223-1, 223-2, 223-3, which transmit driving signals such that operating voltages may be applied to the first, second, and third memory cell blocks 101-1, 101-2, and 101-3.

The pass transistor 223-1 may correspond to one of the second through fifth pass transistors 215-2 through 215-5 of the first pass transistor group 211 of FIG. 4. The pass transistor 223-1 may be connected between wordline driving signal lines SI0 through SIm and wordlines WL0 through WLm, may receive a first block selection signal from a peripheral circuit 200, and may transmit a driving signal such that an operating voltage may be applied to the first memory cell block 101-1.

The pass transistor 223-2 may correspond to one of the second through fifth pass transistors 216-2 through 216-5 of the second pass transistor group 212 of FIG. 4. The pass transistor 223-2 may be connected between the wordline driving signal lines SI0 through SIm and the wordlines WL0 through WLm, may receive a second block selection signal from the peripheral circuit 200, and may transmit a driving signal such that an operating voltage may be applied to the second memory cell block 101-2.

The pass transistor 223-3 may correspond to one of the second through fifth pass transistors 217-2 through 217-5 of the third pass transistor group 213 of FIG. 4. The pass transistor 223-3 may be connected between the wordline driving signal lines SI0 through SIm and the wordlines WL0 through WLm, may receive a third block selection signal from the peripheral circuit 200, and may transmit a driving signal such that an operating voltage may be applied to the third memory cell block 101-3.

The second pass transistor circuit 224 may include pass transistors 224-1, 224-2, and 224-3, which transmit driving signals such that operating voltages may be applied to the first, second, and third memory cell blocks 101-1, 101-2, and 101-3.

The pass transistor 224-1 may correspond to whichever of the second through fifth pass transistors 215-2 through 215-5 of the first pass transistor group 211 of FIG. 4 is not the pass transistor 223-1. The pass transistor 224-1 may be connected between wordline driving signal lines SI0 through SIm and wordlines WL0 through WLm, may receive a first block selection signal from the peripheral circuit 200, and may transmit a driving signal such that an operating voltage may be applied to the first memory cell block 101-1.

The pass transistor 224-3 may correspond to whichever of the second through fifth pass transistors 216-2 through 216-5 of the second pass transistor group 212 of FIG. 4 is not the pass transistor 223-2. The pass transistor 224-2 may be connected between the wordline driving signal lines SI0 through SIm and the wordlines WL0 through WLm, may receive a second block selection signal from the peripheral circuit 200, and may transmit a driving signal such that an operating voltage may be applied to the second memory cell block 101-2.

The pass transistor 224-3 may correspond to whichever of the second through fifth pass transistors 217-2 through 217-5 of the third pass transistor group 213 of FIG. 4 is not the pass transistor 223-3. The pass transistor 224-3 may be connected between the wordline driving signal lines SI0 through SIm and the wordlines WL0 through WLm, may receive a third block selection signal from the peripheral circuit 200, and may transmit a driving signal such that an operating voltage may be applied to the third memory cell block 101-3.

The pass transistors 223-1, 223-2, and 223-3 of the first pass transistor circuit 223 may include the gate structures 223-1G, 223-2G, 223-3G, respectively. The pass transistors 224-1, 224-2, and 224-3 of the second pass transistor circuit 224 may include gate structures 224-1G, 224-2G, and 224-3GG, respectively.

The gate electrodes 223-1G, 223-2G, 223-3G may be on the extensions 225-1, 225-2, 225-3, respectively. The gate electrodes 223-1G, 223-2G, 223-3G may be spaced apart from one another along the second, first, and third directions DR2, DR1, and DR3, respectively. The gate electrodes 223-1G, 223-2G, 223-3G may form an angle greater than 90 degrees (e.g., an angle of 120 degrees) with one another and thus collectively form a Y shape.

The gate electrodes 223-1G, 223-2G, 223-3G may include at least one of, for example, polycrystalline silicon (poly-Si), amorphous silicon (a-Si), titanium (Ti), titanium nitride (TiN), tungsten nitride (WN), titanium aluminum (TiAl), titanium aluminum nitride (TiAlN), tantalum nitride (TaN), titanium carbide (TiC), tantalum carbide (TaC), tantalum carbonitride (TaCN), tantalum silicon nitride (TaSiN), tantalum (Ta), cobalt (Co), ruthenium (Ru), aluminum (Al), tungsten (W), and a combination thereof, but the present disclosure is not limited thereto.

The gate electrodes 224-1G, 224-2G, 224-3G may be on the extensions 226-1, 226-2, and 226-3, respectively. The gate electrodes 224-1G, 224-2G, 224-3G may be spaced apart from one another along the second, first, and third directions DR2, DR1, and DR3, respectively. The (gate electrodes 224-1G, 224-2G, 224-3G may to form an angle greater than 90 degrees (e.g., an angle of 120 degrees) with one another and thus collectively form a Y shape.

The above description of the material of the gate electrodes 223-1G, 223-2G, 223-3G may be also applicable to the (gate electrodes 224-1G, 224-2G, 224-3G.

In some embodiments, the first and second pass transistor circuits 223 and 224 may be high-voltage transistors. For example, a high voltage of about 5 V to about 100 V may be applied to gate electrodes 223-1G, 223-2G, 223-3G and the gate electrodes 224-1G, 224-2G, 224-3G, but the present disclosure is not limited thereto.

Referring to FIG. 8, each of the gate electrodes 223-1G, 223-2G, 223-3G and the gate electrodes 224-1G, 224-2G, 224-3G may include a gate dielectric film 120, a gate conductive layer 130C, and a gate capping film 140, which are sequentially stacked on the first substrate 50.

The gate conductive layer 130C may include first, second, and third conductive films 132, 134, and 136.

The first conductive film 132 may extend along the top surface of the gate dielectric film 120. In some embodiments, the top surface of the first conductive film 132 may be on the same level as uppermost portions of the device isolation films 110A and 110B.

The second conductive film 134 may extend along the top surface of the first conductive film 132. In some embodiments, the second conductive film 134 may extend along parts of the top surfaces of the device isolation films 110A and 110B.

The third conductive film 136 may extend along the top surface of the second conductive film 134. In some embodiments, the third conductive film 136 may extend along parts of the top surfaces of the device isolation films 110A and 110B.

The first, second, and third conductive films 132, 134, and 136 may include a conductive material. For example, the first and second conductive films 132 and 134 may include poly-Si, and the third conductive film 136 may include a metal (e.g., W).

The gate dielectric film 120 may be interposed between the first substrate 50 and the corresponding gate structure. In some embodiments, the end portions of the gate dielectric film 120 may extend to the ends of the corresponding gate structure.

The gate dielectric film 120 may include at least one of, for example, silicon oxide, silicon oxynitride, silicon nitride, silicon oxide, and a high-k material having a greater dielectric constant than silicon oxide, but the present disclosure is not limited thereto. The high-k material may include at least one of, for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but the present disclosure is not limited thereto.

The gate capping film 140 may extend along the top surface of the corresponding gate structure. In some embodiments, the ends of the gate capping film 140 may extend to the ends of the corresponding gate structure. In some embodiments, the gate capping film 140 may not be provided.

The gate capping film 140 may include at least one of, for example, silicon oxide, silicon oxynitride, and silicon nitride, but the present disclosure is not limited thereto. For example, the gate capping film 140 may include silicon nitride.

The first pass transistor circuit 223 may include the gate electrodes 223-1G, 223-2G, 223-3G, the individual sources/drains 223-1S, 223-2S, 223-3S, and the first shared source/drain 223-D1.

The individual sources/drains 223-1S, 223-2S, and 223-3S may be at the ends of the gate electrodes 223-1G, 223-2G, and 223-3G, respectively. The individual sources/drains 223-1S, 223-2S, and 223-3S may be formed in the extensions 225-1, 225-2, and 225-3, respectively.

The first shared source/drain 223-D1 may be between the gate electrodes 223-1G, 223-2G, 223-3G. The first shared source/drain 223-D1 may be formed at the center of the first active region A1.

The individual sources/drains 223-1S, 223-2S, and 223-3S and the first shared source/drain 223-D1 may be doped with a dopant of a second conductivity type, which is different from the first conductivity type. For example, when the pass transistors 223-1, 223-2, and 223-3 are n-type transistors, the individual sources/drains 223-1S, 223-2S, and 223-3S and the first shared source/drain 223-D1 may include n-type impurities. The n-type impurities may include, for example, phosphorus (P) or arsenic (As), but the present disclosure is not limited thereto.

In another example, when the pass transistors 223-1, 223-2, 223-3 are p-type transistors, the individual sources/drains 223-1S, 223-2S, and 223-3S and the first shared source/drain 223-D1 may include p-type impurities. The p-type impurities may include, for example, boron (B), but the present disclosure is not limited thereto.

The second pass transistor circuit 224 may include the include the gate electrodes 224-1G, 224-2G, and 224-3G, the individual sources/drains 224-1S, 224-2S, and 224-3S, and the second shared source/drain 224-D2.

The individual sources/drains 224-1S, 224-2S, and 224-3S may be at the ends of the gate electrodes 224-1G, 224-2G, and 224-3G, respectively. The individual sources/drains 224-1S, 224-2S, and 224-3S may be formed in the extensions A2_1, A2_2, and A2_3, respectively.

The second shared source/drain 224-D2 may be between the gate electrodes 224-1G, 224-2G, and 224-3G. The second shared source/drain 224-D2 may be formed at the center of the second active region A2.

The individual sources/drains 224-1S, 224-2S, and 224-3S and the second shared source/drain 224-D2 may be doped with a dopant of the second conductivity type, which is different from the first conductivity type. For example, when the pass transistors 224-1, 224-2, and 224-3 are n-type transistors, the individual sources/drains 224-1S, 224-2S, and 224-3S and the second shared source/drain 224-D2 may include n-type impurities. The n-type impurities may include, for example, P or As, but the present disclosure is not limited thereto.

In another example, when the pass transistors 224-1, 224-2, and 224- are p-type transistors, the individual sources/drains 224-1S, 224-2S, and 224-3S and the second shared source/drain 224-D2 may include p-type impurities. The p-type impurities may include, for example, B, but the present disclosure is not limited thereto.

Although not specifically illustrated, each of the individual sources/drains 223-1S, 223-2S, and 223-3S, the first shared source/drain D1, the individual sources/drains 224-1S, 224-2S, and 224-3S, and the second shared source/drain 224-D2 may include a low-concentration impurity region and a high-concentration impurity region. The high-concentration impurity region may be formed in the low-concentration impurity region. The low-concentration impurity region may surround the high-concentration impurity region. The doping concentration of the high-concentration impurity region may be higher than the doping concentration of the low-concentration impurity region.

An interlayer insulating film 190 may be formed on the first substrate 50. The interlayer insulating film 190 may cover the first substrate 50, the device isolation films 110A and 110B, and the first and second pass transistor circuits 223 and 224.

The interlayer insulating film 190 may include at least one of, for example, silicon oxide, silicon nitride, silicon oxynitride, and a low-k material having a smaller dielectric constant than silicon oxide. The low-k material may include at least one of, for example, flowable oxide (FOX), tonen silazene (TOSZ), undoped silicate glass (USG), borosilicate glass (BSG), phosphosilicate glass (PSG), borophosphosilicate glass (BPSG), plasma-enhanced tetra-ethyl-ortho-silicate (PETEOS), fluoride silicate glass (FSG), carbon-doped silicon oxide (CDO), Xerogel, Aerogel, amorphous fluorinated carbon, organo silicate glass (OSG), parylene, bisbenzocyclobutene (BCB), SiLK, polyimide, a porous polymeric material, and a combination thereof, but the present disclosure is not limited thereto.

Although not specifically illustrated, gate contacts may be connected to the gate electrodes 223-1G, 223-2G, and 223-3G and the gate electrodes 224-1G, 224-2G, and 224-3G. For example, the gate contacts may extend in the vertical direction Z to penetrate the interlayer insulating film 190 and the gate capping films 140 of the gate electrodes 223-1G, 223-2G, and 223-3G and the gate electrodes 224-1G, 224-2G, and 224-3G. The gate contacts may be electrically connected to the gate electrodes 223-1G, 223-2G, and 223-3G and the gate electrodes 224-1G, 224-2G, and 224-3G and may thus apply voltages to the gate electrodes 223-1G, 223-2G, and 223-3G and the gate electrodes 224-1G, 224-2G, and 224-3G.

The gate contacts may include a metal such as, for example, Al, copper (Cu), or W, but the present disclosure is not limited thereto.

The individual source/drain contacts 223-1SC, 223-2SC, and 223-3SC may be connected to the individual sources/drains 223-1S, 223-2S, and 223-3S, respectively. The first shared source/drain contact 223-DC may be connected to the first shared source/drain 223-D1.

For example, the individual source/drain contacts 223-1SC, 223-2SC, and 223-3SC and the first shared source/drain contact 223-DC may extend in the vertical direction Z to penetrate the interlayer insulating film 190. The individual source/drain contacts 223-1SC, 223-2SC, and 223-3SC may be electrically connected to the individual sources/drains 223-1S, 223-2S, and 223-3S, respectively, and may thus apply voltages to the individual sources/drains 223-1S, 223-2S, and 223-3S, respectively. The first shared source/drain contact 223-DC may be electrically connected to the first shared source/drain 223-D1 and may thus apply a voltage to the first shared source/drain 223-D1. In some embodiments, the individual source/drain contacts 223-1SC, 223-2SC, and 223-3SC and the first shared source/drain contact 223-DC may be in contact with the high-concentration impurity regions.

The first shared source/drain 223-D1 may be electrically connected to one of the wordline driving signal lines (SI0) through SIm through the first shared source/drain contact 223-DC and may thus receive an operating voltage from the peripheral circuit 200. The individual sources/drains 223-1S, 223-2S, and 223-3S may be electrically connected to the first, second, and third memory cell blocks 101-1, 101-2, and 101-3, respectively, through the individual sources/drain contacts 223-1SC, 223-2SC, and 223-3SC, respectively.

The individual source/drain contacts 223-1SC, 223-2SC, and 223-3SC and the first shared source/drain contact 223-DC may include a metal such as, for example, Al, Cu, or W, but the present disclosure is not limited thereto.

The individual source/drain contacts 224-1SC, 224-2SC, and 224-3SC may be connected to the individual sources/drains 224-1S, 224-2S, and 224-3S, respectively. The second shared source/drain contact 224-DC may be connected to the second shared source/drain 224-D2.

For example, the individual source/drain contacts 224-1SC, 224-2SC, and 224-3SC and the second shared source/drain contact 224-DC may extend in the vertical direction Z to penetrate the interlayer insulating film 190. The individual source/drain contacts 224-1SC, 224-2SC, and 224-3SC may be electrically connected to the individual sources/drains 224-1S, 224-2S, and 224-3S, respectively, and may thus apply voltages to the individual sources/drains 224-1S, 224-2S, and 224-3S, respectively. The second shared source/drain contact 224-DC may be electrically connected to the second shared source/drain 224-D2 and may thus apply a voltage to the second shared source/drain 224-D2. In some embodiments, the individual source/drain contacts 224-1SC, 224-2SC, and 224-3SC and the second shared source/drain contact 224-DC may be in contact with the high-concentration impurity regions.

The second shared source/drain 224-D2 may be electrically connected to one of the wordline driving signal lines SI0 through SIm through the second shared source/drain contact 224-DC and may thus receive an operating voltage from the peripheral circuit 200. The individual sources/drains 224-1S, 224-2S, and 224-3S may be electrically connected to the first, second, and third memory cell blocks 101-1, 101-2, and 101-3, respectively, through the individual sources/drain contacts 224-1SC, 224-2SC, and 224-3SC, respectively.

The above description of the material of the individual sources/drain contacts 223-1SC, 223-2SC, and 223-3SC and the first shared source/drain contact 223-DC may also be applicable to the individual sources/drain contacts 224-1SC, 224-2SC, and 224-3SC and the second shared source/drain contact 224-DC.

The locations of the individual sources/drain contacts 223-1SC, 223-2SC, and 223-3SC and the first shared source/drain contact 223-DC are not particularly limited. Also, the locations of the individual sources/drain contacts 224-1SC, 224-2SC, and 224-3SC and the second shared source/drain contact 224-DC are not particularly limited.

In some embodiments, three high-voltage transistors sharing one source/drain may collectively form a Y shape. Accordingly, the area occupied by the transistors can be reduced, and a transistor array with an increased distance between shared source/drains can be formed. As a result, the dose of impurities injected into the shared source/drains can be reduced, and thus, a semiconductor memory device occupying only a small area and having an improved breakdown voltage characteristic can be provided.

FIGS. 9 through 12 are layout views illustrating the pass transistor layouts of semiconductor memory devices according to some embodiments of the present disclosure. For convenience, the embodiments of FIGS. 9 through 12 will hereinafter be described, focusing mainly on the embodiment of FIGS. 1 through 8.

Each of the semiconductor memory devices of FIGS. 9 through 12 may further include third through seventh active regions A3, A4, A5, A6, A7, which are spaced apart from first and second active regions A1 and A2.

Each of the third through seventh active regions A3 through A7 may include three extensions, which extend in first, second, and third directions DR1, DR2, and DR3.

The three extensions of each of the third through seventh active regions A3 through A7 may collectively form a Y shape. In this case, the three extensions of each of the third through seventh active regions A3 through A7 may form an angle greater than 90 degrees relative to one another.

Each of the semiconductor memory devices of FIGS. 9 through 12 may further include third through seventh pass transistor circuits 233, 234, 235, 236, 237, which are spaced apart from first and second pass transistor circuits 223 and 224 and transmit driving signals to memory cell blocks.

The third through seventh pass transistor circuits 233, 234, 235, 236, 237 may be in the third through seventh active regions A3, A4, A5, A6, A7, respectively.

Each of the third through seventh pass transistor circuits 233, 234, 235, 236, 237 may include three pass transistors, which may be similar to the three pass transistors of the first or second pass transistor circuits 223 or 224 of FIGS. 1 through 8.

The third pass transistor circuit 233 may include three pass transistors, which transmit driving signals such that operating voltages may be applied to first, second, and third memory cell blocks 101-1, 101-2, and 101-3.

The third pass transistor circuit 233 may include gate electrodes 233-1G, 233-2G, and 233-3G, third individual sources/drains 233-1S, 233-2S, and 233-3S, and a third shared source/drain 233-D3.

The gate electrodes 233-1G, 233-2G, and 233-3G may be on the three extensions of the third active region A3, which extend in the first, second, and third directions DR1, DR2, and DR3 to form an angle greater than 90 degrees relative to one another. The gate electrodes 233-1G, 233-2G, and 233-3G may be spaced apart from one another along the second, first, and third directions DR2, DR1, and DR3, respectively. The gate electrodes 233-1G, 233-2G, and 233-3G may be spaced apart from one another to form an angle greater than 90 degrees (e.g., 120 degrees) with one another to collectively form a Y shape.

The fourth pass transistor circuit 234 may include three pass transistors, which transmit driving signals such that operating voltages may be applied to the first, second, and third memory cell blocks 101-1, 101-2, and 101-3.

The fourth pass transistor circuit TR4 may include gate electrodes 234-1G, 234-2G, 234-3G, fourth individual sources/drains 234-1S, 234-2S, 234-3S, and a fourth shared source/drain 234-D4.

The gate electrodes 234-1G, 234-2G, 234-3G may be on the three extensions of the fourth active region A4, which extend in the first, second, and third directions DR1, DR2, and DR3 to form an angle greater than 90 degrees relative to one another. The gate electrodes 234-1G, 234-2G, 234-3G may be spaced apart from one another along the second, first, and third directions DR2, DR1, and DR3, respectively. The gate electrodes 234-1G, 234-2G, 234-3G may be spaced apart from one another to form an angle greater than 90 degrees (e.g., 120 degrees) relative to one another to collectively form a Y shape.

The fifth pass transistor circuit 235 may include gate electrodes 235-1G, 235-2G, and 235-3G, fifth individual sources/drains 235-1S, 235-2S, and 235-3S, and a fifth shared source/drain 235-D5.

The sixth pass transistor circuit 236 may include gate electrodes 236-1G, 236-2G, and 236-3G, sixth individual sources/drains 236-1S, 236-2S, and 236-3S, and a sixth shared source/drain 236-D6.

The seventh pass transistor circuit 237 may include gate electrodes 237-1G, 237-2G, and 237-3G, seventh individual sources/drains 237-1S, 237-2S, and 237-3S, and a seventh shared source/drain 237-D7.

Figure 9:
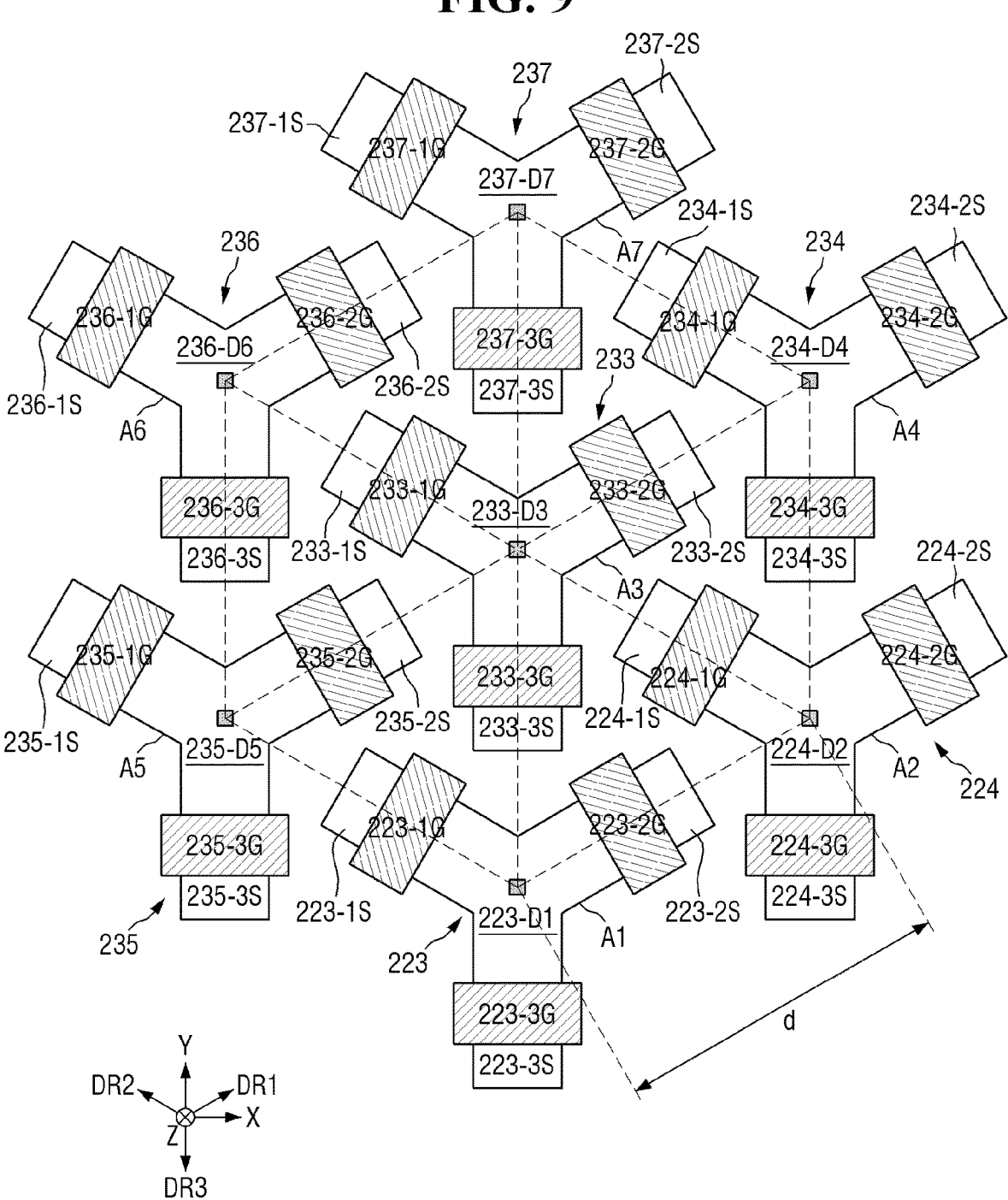
FIGS. 9, 10, 11, and 12 are layout views illustrating pass transistor layouts of semiconductor memory devices according to some embodiments of the present disclosure.

Referring to FIG. 9, the first and second active regions A1 and A2 may be in a Y shape and may be arranged side-by-side in the first direction DR1. The second and third active regions A2 and A3 may be in the Y shape and may be arranged side-by-side in the second direction DR2. The first and third active regions A1 and A3 may be in the Y shape and may be arranged side-by-side in a second horizontal direction Y.

Referring to FIG. 9, the centers of a first shared source/drain 223-D1, a second shared source/drain 224-D2, and the third shared source/drain 233-D3 may form an equilateral triangular shape together. In this case, a distance "d" between the centers of the first and second shared sources/drains D1 and D2, the distance between the centers of the second and third shared source/drains D2 and D3, and the distance between the centers of the first and third shared sources/drains D1 and D3 may be equal.

The centers of the first, second, fourth, fifth, sixth, and seventh shared sources/drains 223-D1, 224-D2, 234-D4, 235-D5, 236-D6, and 237-D7 of the first, second, fourth, fifth, sixth, and seventh pass transistors 223, 224, 234, 235, 236, and 237 may form a regular hexagonal shape that is centered on the third pass transistor circuit 233.

Figure 10:
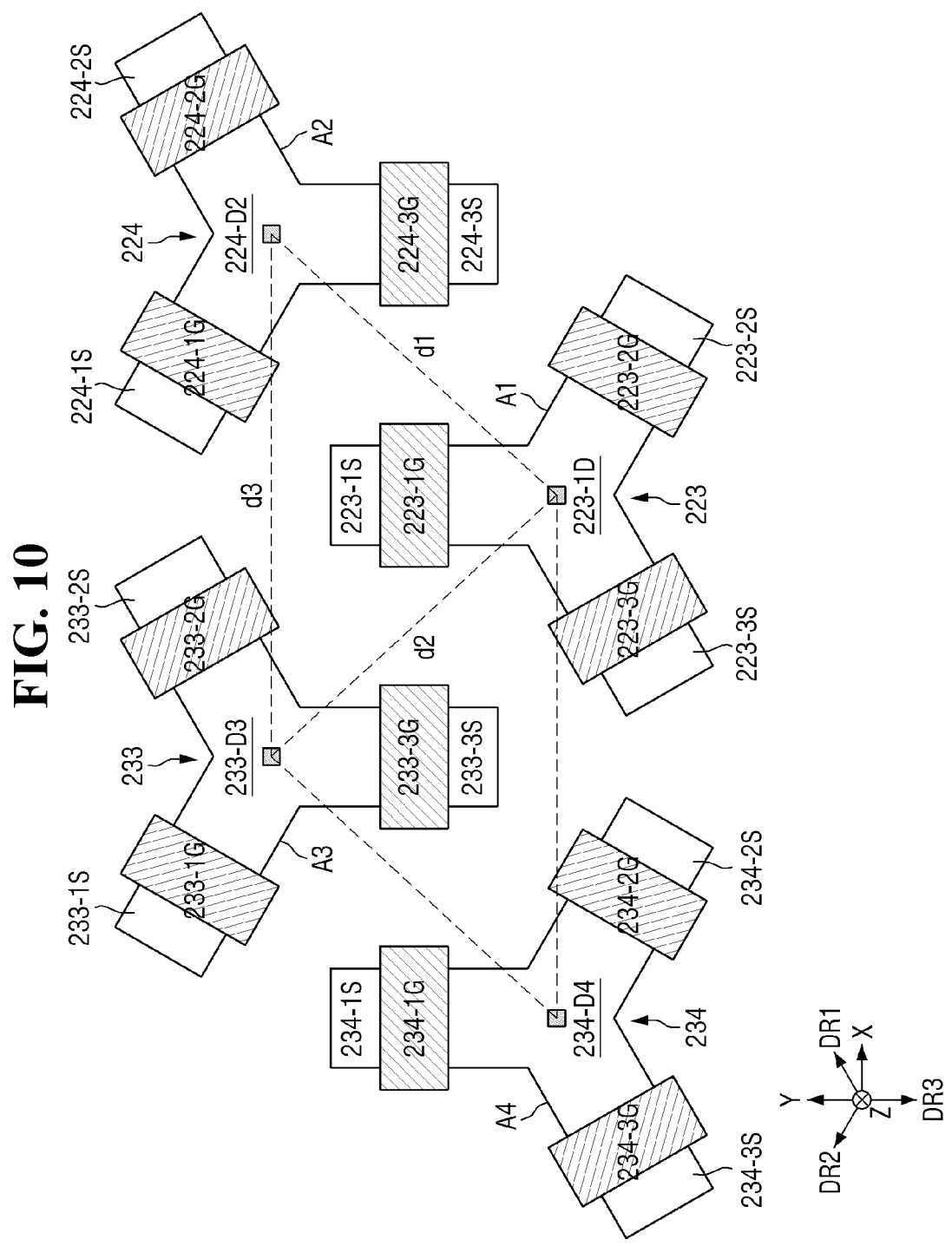

Referring to FIG. 10, the first and second active regions A1 and A2 may be in a Y shape and may be arranged in the first direction DR1 to be inverted with respect to each other. The first and third active regions A1 and A3 may be in the Y shape and may be arranged in the second direction DR2 to be inverted with respect to each other. The second and third active regions A2 and A3 may be in the Y shape and may be arranged in a first horizontal direction X to be inverted with respect to each other.

Referring to FIG. 10, the centers of the first, second, and third shared sources/drains 223-D1, 224-D2, and 233-D3 may form an isosceles triangular shape together. In this case, a first distance "d1" between the centers of the first and second shared sources/drains 223-D1 and 224-D2 and a second distance "d2" between the centers of the first and third shared sources/drains 223-D1 and 233-D3 may be the same. A third distance "d3" between the centers of the second and third shared sources/drains 224-D2 and 233-D3 may differ from the first distance "d1" between the centers of the first and second shared sources/drains 223-D1 and

224-D2 or the second distance "d2" between the centers of the first and third shared sources/drains 223-D1 and 233-D3.

Figure 11:
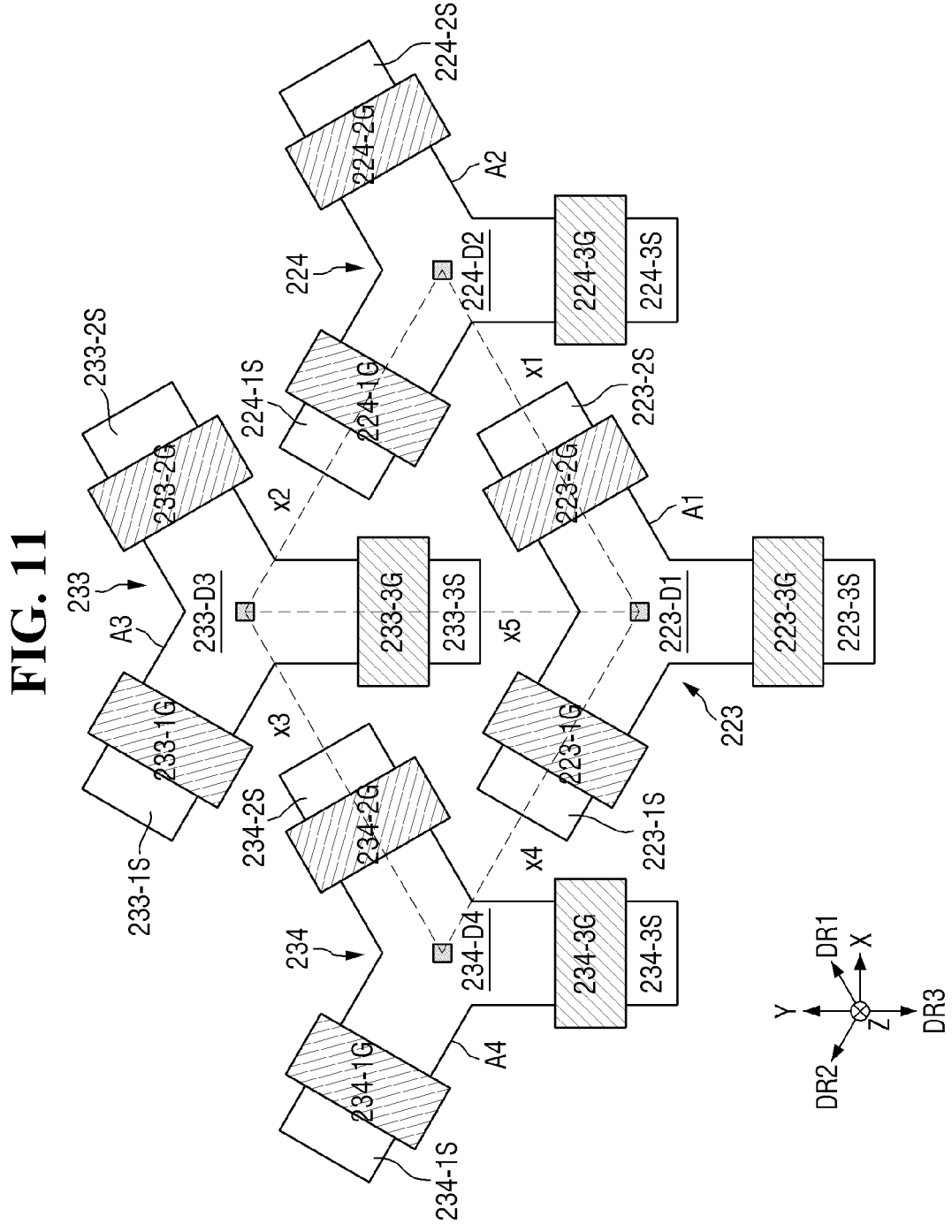

Referring to FIG. 11, the first and second active regions A1 and A2 may be in a Y shape and may be arranged side-by-side in the first direction DR1. The second and third active regions A2 and A3 may be in the Y shape and may be arranged side-by-side in the second direction DR2. The first and third active regions A1 and A3 may be in the Y shape and may be arranged side-by-side in the second horizontal direction Y. The first and fourth active regions A1 and A4 may be in the Y shape and may be arranged side-by-side in the second direction DR2.

Referring to FIG. 11, the centers of the first through fourth shared sources/drains 223-D1, 224-D2, 233-D3, 234-D4 may collectively form a rhombus shape. In this case, a first distance "x1" between the centers of the first and second shared sources/drains 223-D1 and 224-D2, a second distance "x2" between the centers of the second and third shared sources/drains 224-D2 and 233-D3, a third distance "x3" between the centers of the third and fourth shared sources/drains 233-D3 and 234-D4, and a fourth distance "x4" between the centers of the first and fourth shared sources/drains 223-D1 and 234-D4 may be equal.

A fifth distance "x5" between the centers of the first and third shared sources/drains 223-D1 and 233-D3 may differ from the first distance "x1" between the centers of the first and second shared sources/drains 223-D1 and 224-D2, the second distance "x2" between the centers of the second and third shared sources/drains 224-D2 and 233-D3, the third distance "x3" between the centers of the third and fourth shared sources/drains 233-D3 and 234-D4, and the fourth distance "x4" between the centers of the first and fourth shared sources/drains 223-D1 and 234-D4.

Figure 12:
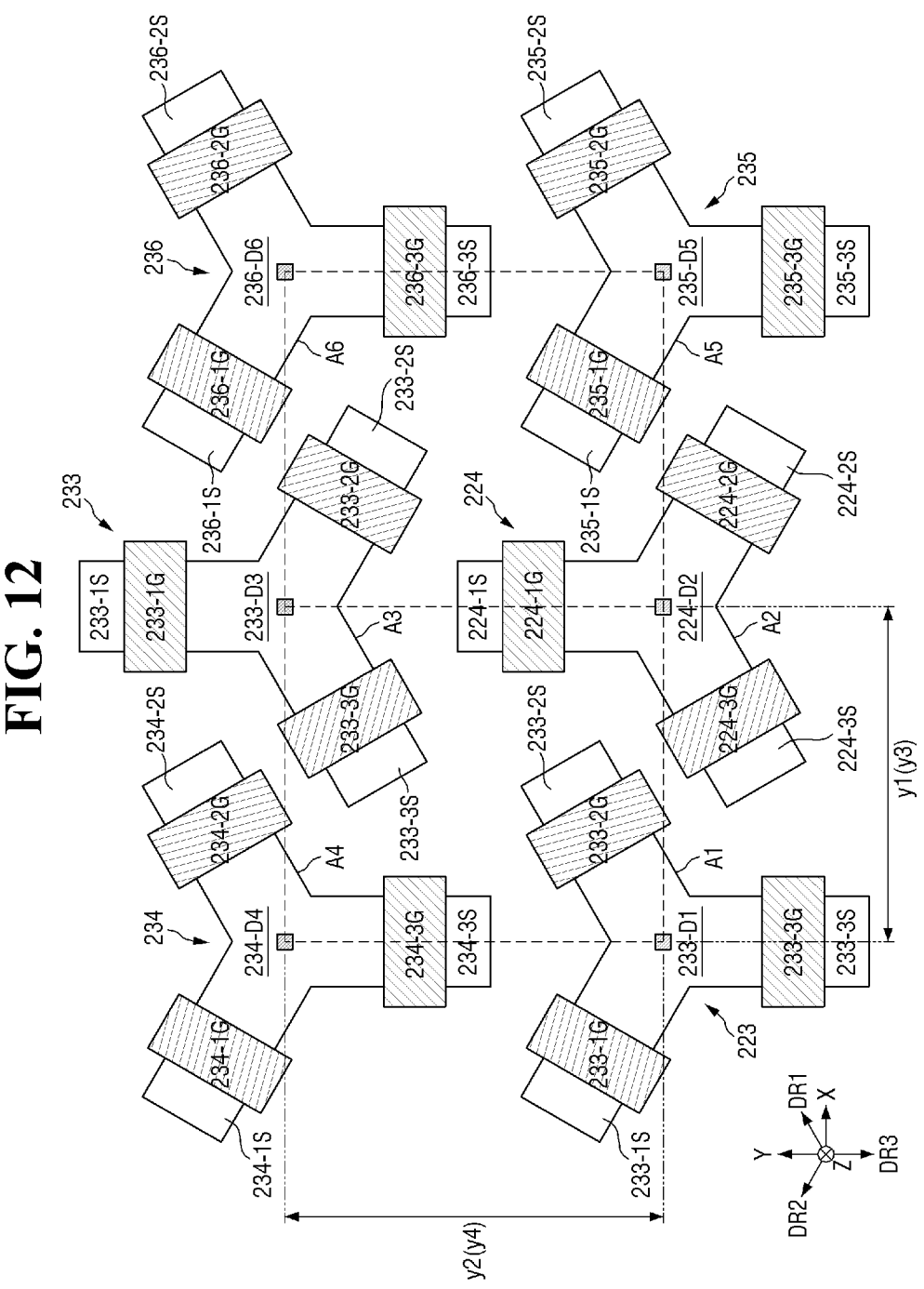

Referring to FIG. 12, the first and second active regions A1 and A2 may be in a Y shape and may be arranged adjacent to each other in the first horizontal direction X. The third and fourth active regions A3 and A4 may be in the Y shape and may be arranged adjacent to each other in the first horizontal direction X to be inverted with respect to each other. The second and third active regions A2 and A3 may be in the Y shape and may be arranged adjacent to each other in the first horizontal direction X to be inverted with respect to each other. The first and fourth active regions A1 and A4 may be in the Y shape and may be arranged adjacent to each other in the first horizontal direction X to be inverted with respect to each other.

Referring to FIG. 12, the centers of the first through fourth shared sources/drains 223-D1, 224-D2, 233-D3, 234-D4 may collectively form a square shape. In this case, a first distance "y1" between the first and second shared sources/drains 223-D1 and 224-D2, a second distance "y2" between the second and third shared sources/drains 224-D2 and 233-D3, a third distance "y3" between the third and fourth shared sources/drains 233-D3 and 234-D4, and a fourth distance "y4" between the first and fourth shared sources/drains 223-D1 and 234-D4 may be equal.

Nonvolatile memory devices including semiconductor memory devices according to some embodiments of the present disclosure will hereinafter be described with reference to FIGS. 1 through 16.

Figure 13:
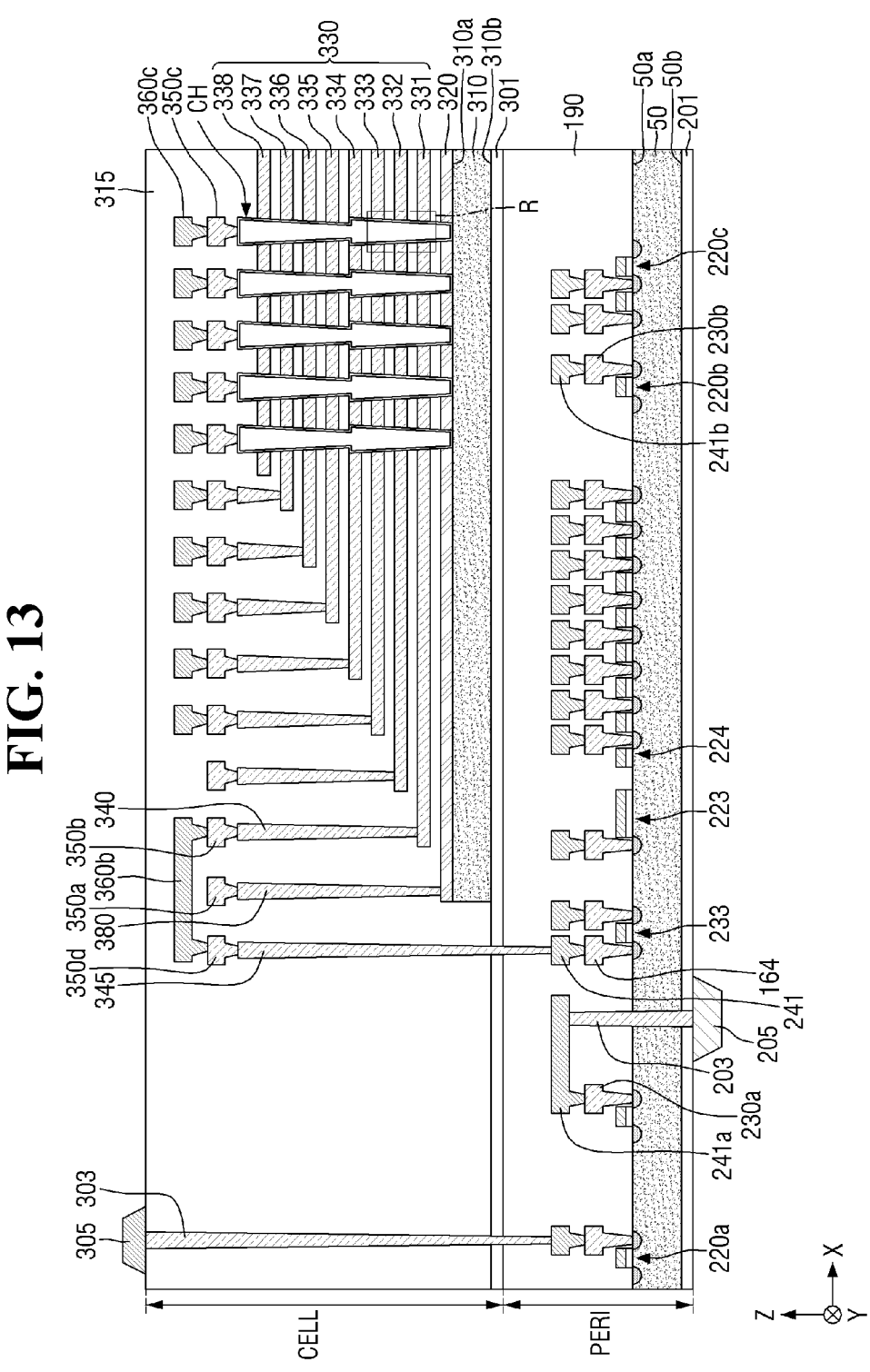
FIG. 13 is a cross-sectional view of a nonvolatile memory device including a semiconductor memory device according to some embodiments of the present disclosure.
Figure 14:
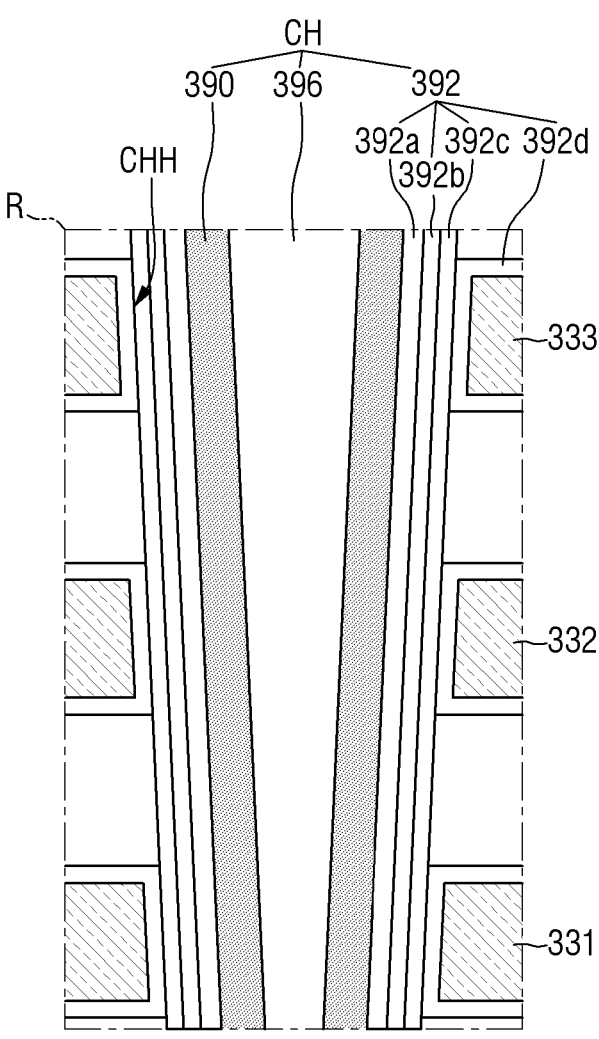
FIGS. 14 and 15 are enlarged cross-sectional views of an area R of FIG. 13.
Figure 15:
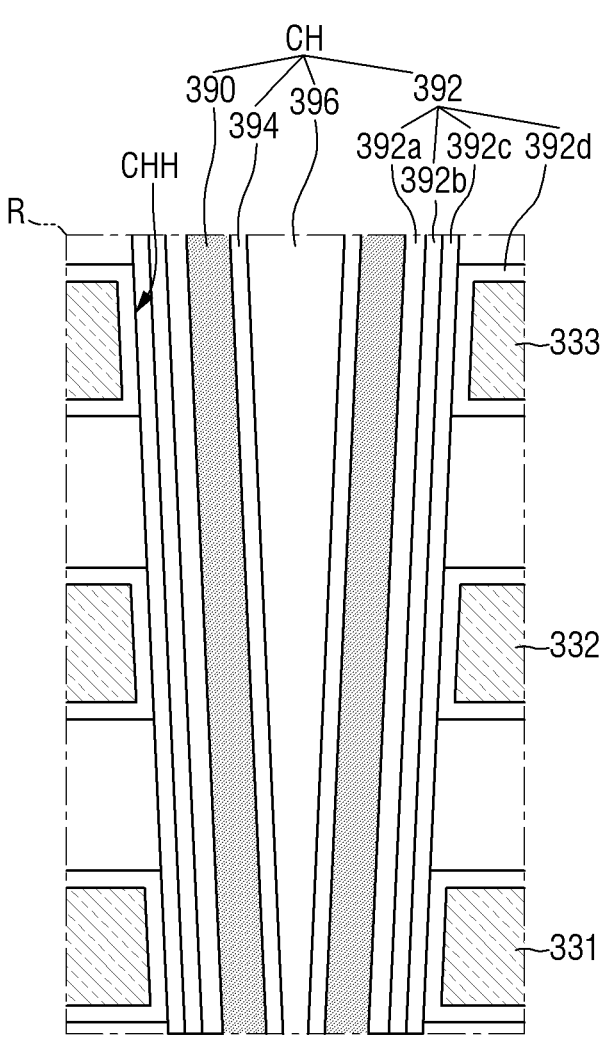
Figure 16:
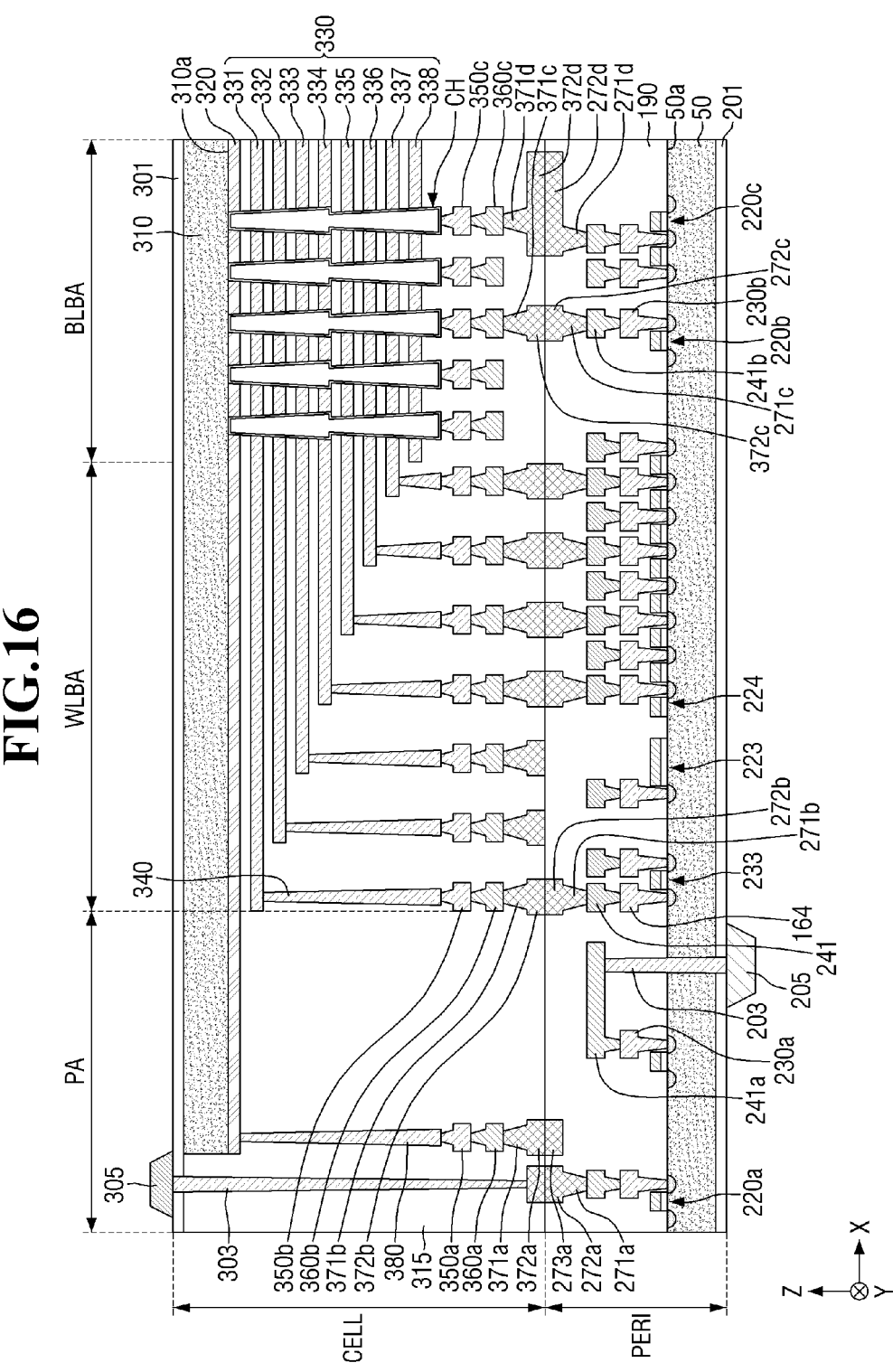
FIG. 16 is a cross-sectional view of a nonvolatile memory device including a semiconductor memory device according to some embodiments of the present disclosure.

FIG. 13 is a cross-sectional view of a nonvolatile memory device including a semiconductor memory device according to some embodiments of the present disclosure. FIGS. 14 and 15 are enlarged cross-sectional views of an area R of FIG. 13. FIG. 16 is a cross-sectional view of a nonvolatile memory device including a semiconductor memory device according to some embodiments of the present disclosure.

For convenience, the embodiments of FIGS. 13 through 16 will hereinafter be described, focusing mainly on the differences with the embodiments of FIGS. 1 through 12.

Referring to FIGS. 13 through 16, first, second, and third circuit devices 223, 224, and 233 may refer to the first, second, and third pass transistor circuits 223, 224, and 233, respectively, of any one of FIGS. 1 through 12.

Referring to FIG. 13, the nonvolatile memory device may include a peripheral circuit region (PERI) and a cell region (CELL).

The peripheral circuit region PERI may include a first substrate 50, an interlayer insulating film 190, a plurality of circuit devices 223, 224, 233, 220a, 220b, and 220c that are formed on the first substrate 50, first metal layers 164, 230a, and 230b that are connected to the circuit devices 223, 224, 233, 220a, 220b, and 220c, and second metal layers 241, 241a, and 241b that are formed on the first metal layers 164, 230a, and 230b.

The first substrate 50 may have first and second surfaces 50a and 50b, which are opposite to each other. The peripheral circuit region PERI may be on the first surface 50a of the first substrate 50. In some embodiments, the first, second, and third circuit devices 223, 224, and 234 may provide a decoder circuit (e.g., "1110" of FIG. 17) in the peripheral circuit region PERI. In some embodiments, a fourth circuit device 220a may provide a logic circuit (e.g., "1120" of FIG. 17) in the peripheral circuit region PERI. In some embodiments, a fifth circuit device 220b may provide a page buffer (e.g., "1120" of FIG. 17) in the peripheral circuit region PERI.

FIGS. 13 through 16 illustrate that only the first metal layers (164, 230a, and 230b) and the second metal layers 241, 241a, and 241b are provided, but the present disclosure is not limited thereto. Alternatively, other additional metal layers may be formed on the second metal layers 241, 241a, and 241b, and at least one of the additional metal layers may include a metal (e.g., A1) having a lower resistance than the second metal layers 241, 241a, and 241b, which may be formed of Cu.

In some embodiments, the first metal layers 164, 230a, and 230b may be formed of W, which has a relatively high resistance, and the second metal layers 241, 241a, and 241b may be formed of Cu, which has a relatively low resistance.

The interlayer insulating film 190 may be on the first substrate 50 to cover the circuit devices 223, 224, 233, 220a, 220b, and 220c, the first metal layers 164, 230a, and 230b, and the second metal layers 241, 241a, and 241b.

The cell region CELL may provide at least one memory block. The cell region CELL may include a second substrate 310 and a common source line 320. The second substrate 310 may have first and second surfaces 310a and 310b, which are opposite to each other. The cell region CELL may be on the first surface 310a of the second substrate 310.

A plurality of wordlines 330 may be stacked on the second substrate 310 in a vertical direction Z, which intersects the top surface of the second substrate 310. String selection lines (e.g., "SSL0" through "SSL2" of FIG. 5) and ground selection lines (e.g., "GSL0" through "GSL2" of FIG. 5) may be above or below the wordlines 330, and the wordlines 330 may be between the string selection lines and the ground selection lines.

Channel structures (CH) may extend in the vertical direction Z to penetrate the wordlines 330, the string selection lines, and the ground selection lines. Referring to FIGS. 14 and 15, each of the channel structures CH may include a semiconductor pattern 390 and an information storage film 392, which are formed on the sidewalls of a channel hole "CHH" that penetrates the wordlines 330.

The semiconductor pattern 390 may extend in the vertical direction Z. The semiconductor pattern 390 is illustrated as having a cup shape, but the present disclosure is not limited thereto. Alternatively, the semiconductor pattern 390 may have various other shapes, such as a cylindrical shape, a rectangular container shape, or a non-hollow pillar shape. The semiconductor pattern 390 may include a semiconductor material such as, for example, monocrystalline silicon, polycrystalline silicon, an organic semiconductor, or a carbon nanostructure, but the present disclosure is not limited thereto.

The information storage film 392 may be interposed between the semiconductor pattern 390 and the wordlines 330. For example, the information storage film 392 may extend along the sides of the semiconductor pattern 390.

In some embodiments, the information storage film 392 may be formed as a multifilm. For example, the information storage film 392 may include a tunnel insulating film 392a, a charge storage film 392b, and a blocking insulating film 392c, which are sequentially stacked on the semiconductor pattern 390. The tunnel insulating film 392a may include silicon oxide or a high-k material (e.g., aluminum oxide $(Al_2O_3)$ or hafnium oxide $(HfO_2)$) having a greater dielectric constant than silicon oxide. The charge storage film 392b may include, for example, silicon nitride. The blocking insulating film 392c may include silicon oxide or a high-k material having a greater dielectric constant than silicon oxide. In some embodiments, the information storage film 392 may further include a gate insulating film 392d, which extends along the surfaces of the wordlines 330.

In some embodiments, the channel structures CH may further include a filler pattern 396. The filler pattern 396 may be formed to fill the interior of the semiconductor pattern 130, which is cup-shaped. The filler pattern 396 may include an insulating material such as, for example, silicon oxide, but the present disclosure is not limited thereto.

The common source line 320 may be formed to be connected to the semiconductor patterns 390 of the channel structures CH.

Although not specifically illustrated, in some embodiments, the channel structures CH may be buried in the second substrate 310 through the common source line 320. The common source line 320 may be connected to sides of the semiconductor patterns 390 of the channel structures CH through parts of the information storage films 392 of the channel structures CH.

Although not specifically illustrated, in some embodiments, the common source line 320 may be at least partially buried in the second substrate 310. For example, the common source line 320 may be formed from the second substrate 310 by selective epitaxial growth (SEG). The channel structures CH may be connected to the top surface of the common source line 320 through parts of the information storage films 392 of the channel structures CH.

The channel structures CH may be electrically connected to first metal layers 350c and second metal layers 360c. For example, the first metal layers 350c may be bitline contacts, and the second metal layers 360c may correspond to bitlines (e.g., "BL0" through "BL2" of FIG. 5). In some embodiments, bitlines 360c may extend in a direction parallel to the top surface of the second substrate 310 (e.g., in a second horizontal direction Y). In some embodiments, the bitlines 360c may be electrically connected to the fifth circuit device 220b, which provides a page buffer (e.g., "1120" of FIG. 17) in the peripheral circuit region PERI.

The wordlines 330 may extend in a direction parallel to the top surface of the second substrate 310 (e.g., in a first horizontal direction X) and may be connected to a plurality of cell contact plugs 340. The wordlines 330 and the cell contact plugs 340 may be connected to each other on pads that are provided by at least some of the wordlines 330 extending in different lengths from one another. First metal layers 350b and second metal layers 360b may be sequentially formed on the cell contact plugs 340, which are connected to the wordlines 330.

In some embodiments, the cell contact plugs 340 may be electrically connected to the first, second, and third circuit devices 223, 224, and 233, which provide a decoder circuit (e.g., "1110" of FIG. 17) in the peripheral circuit region PERI. For example, the first metal layers 350b, which are connected to the cell contact plugs 340, may be connected to the first metal layers 350d via the second metal layers 360b, and the first metal layers 350d may be connected to second metal layers 241 via connection contact plugs 345. Accordingly, the first, second, and third circuit devices 223, 224, and 233 may be electrically connected to the wordlines 330. For example, the first circuit device 223 may be electrically connected to some of the wordlines 330, the second circuit device 224 may be electrically connected to some of the wordlines 330 that are not electrically connected to the first circuit device 223, and the third circuit device 233 may be electrically connected to some of the wordlines 330 that are not electrically connected to the first and second circuit devices 223 and 224.

Figure 17:
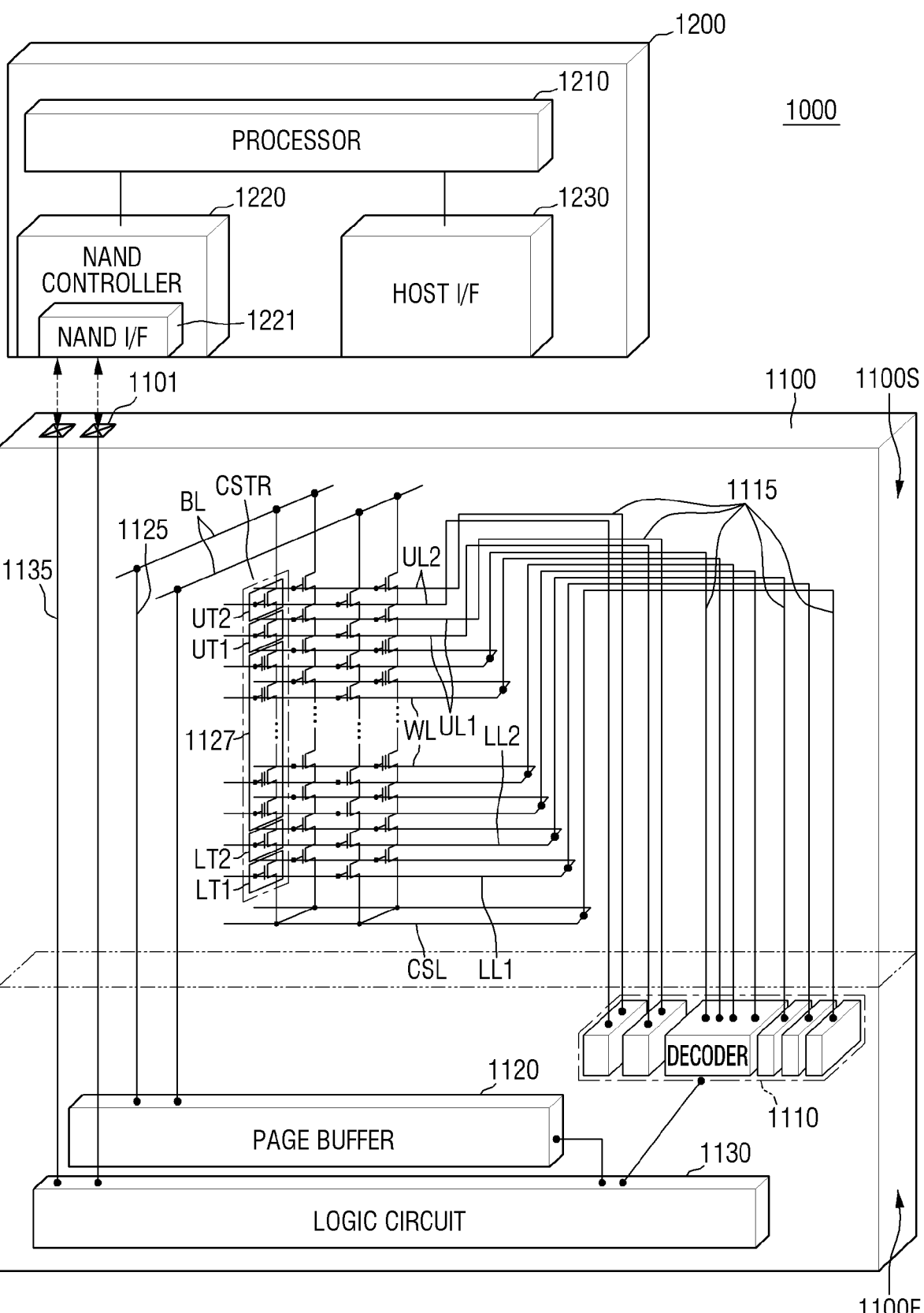
FIG. 17 is a block diagram of an electronic system including a semiconductor memory device according to some embodiments of the present disclosure.

In some embodiments, operating voltages for the first, second, and third circuit devices 223, 224, and 233 may differ from an operating voltage for the fifth circuit device 220b, which provides a page buffer (e.g., "1120" of FIG. 17).

A common source line contact plug 380 may be electrically connected to the common source line 320. The common source line contact plug 380 may be formed of a conductive material, such as a metal, a metal compound, or polysilicon, and a first metal layer 350a may be formed on the common source line contact plug 380.

In some embodiments, a lower insulating film 201 may be formed below the first substrate 50 to cover the bottom surface of the first substrate 50, and a first input/output pad 205 may be formed on the lower insulating film 201. The first input/output pad 205 may be connected to at least one of the circuit devices 223, 224, 233, 220a, and 220b, which are in the peripheral circuit region PERI via a first input/output contact plug 203 and may be separated from the first substrate 50 by the lower insulating film 201. A side insulating film (not illustrated) may be between and electrically isolate the first input/output contact plug 203 and the first substrate 50 substrate 50.

In some embodiments, an upper insulating film 301 may be formed above the second substrate 310 to cover the top surface of the second substrate 310, and a second input/output pad 305 may be formed above the upper insulating film 301. The second input/output pad 305 may be connected to at least one of the circuit devices 223, 224, 233, 220a, and 220b, which are in the peripheral circuit region PERI via a second input/output contact plug 303.

In some embodiments, the second substrate 310 and the common source line 320 may not be in a region where the second input/output contact plug 303 is located. The second input/output pad 305 may not overlap with the wordlines 330 in the vertical direction Z. The second input/output contact plug 303 may be separated from the second substrate 310 and may be connected to the second input/output pad 305 through an interlayer insulating film 315 of the cell region CELL.

In some embodiments, the first and second input/output pads 205 and 305 may be selectively formed. For example, the nonvolatile memory device may include only the first input/output pad 205, which is on the first substrate 50, or only the second input/output pad 305, which is on the second substrate 310. In another example, the nonvolatile memory device may include both the first and second input/output pads 205 and 305.

Referring to FIG. 15, each of the channel structures CH may include an information storage film 392, a semiconductor pattern 390, a variable resistance film 394, and a filler pattern 396. For example, channel holes CHH, which extend in the vertical direction Z and penetrate the wordlines 330, may be formed. The information storage film 392, the semiconductor pattern 390, the variable resistance film 394, and the filler pattern 396 may be sequentially stacked in the channel holes CHH. In some embodiments, the semiconductor pattern 390, the variable resistance film 394, and the filler pattern 396 may extend conformally along the profile of each of the channel holes CHH. The filler pattern 396 may fill the spaces in the channel holes CHH that remain unfilled with the information storage film 392, the semiconductor pattern 390, and the variable resistance film 394.

The variable resistance film 394 may extend along the inner side surfaces of the semiconductor pattern 390. For example, the variable resistance film 394 may extend conformally along the inner sidewalls of the semiconductor pattern 390.

The variable resistance film 394 may include a variable resistance material. The variable resistance material may have a variable resistance that is a function of the current flowing through the variable resistance film 394. For example, the variable resistance film 394 may include a material having a switching characteristic such as, for example, at least one of silicon oxide ($SiO_x$), aluminum oxide (AlO), magnesium oxide (MgO), zirconium oxide (ZrO), hafnium oxide (HfO), silicon nitride (SiN), tungsten oxide (WO), titanium oxide (TiO), tantalum oxide (TaO), and a combination thereof, but the present disclosure is not limited thereto.

In some embodiments, the variable resistance film 394 may include a transition metal oxide (TMO). For example, the variable resistance film 394 may include at least one of HfO and TaO.

Parts of the variable resistance film 394 that are opposite to the wordlines 330 may form areas capable of storing information, i.e., memory cells.

FIG. 16 is a cross-sectional view of a nonvolatile memory device including a semiconductor memory device according to some embodiments of the present disclosure. For convenience, the embodiment of FIG. 16 will hereinafter be described, focusing mainly on the differences with the embodiments of FIGS. 1 through 15.

Referring to FIG. 16, the nonvolatile memory device may have a chip-to-chip (C2C) structure.

Bonding metals 372a, 372b, 372c, and 372d on a first substrate 50 and bonding metals 273a, 272b, 272c, and 272d on a second substrate 310 may be bonded together such that a first surface 50a of the first substrate 50 and a first surface 310a of the second substrate 310 may face each other.

The C2C structure may refer to a structure obtained by fabricating an upper chip, including a cell region CELL, on a first wafer; fabricating a lower chip, including a peripheral circuit region PERI, on a second wafer that is different from the first wafer; and bonding the upper and lower chips together. For example, the upper and lower chips may be bonded to each other by electrically connecting bonding metals formed in an uppermost metal layer of the upper chip and bonding metals formed in an uppermost metal layer of the lower chip. For example, if the bonding metals are formed of Cu, the upper and lower chips may be Cu—Cu-bonded to each other. Alternatively, the bonding metals may be formed of Al or W.

In some embodiments, each of the peripheral circuit region PERI and the cell region CELL may include an external pad bonding area PA, a wordline bonding area WLBA, and a bitline bonding area BLBA.

The wordline bonding area WBLA may be defined as a region where a plurality of cell contact plugs 340 are. Lower bonding metals 271b and 272b may be formed on a second metal layer 241 of the wordline bonding area WLBA. In the wordline bonding area WLBA, the lower bonding metals 271b and 272b of the peripheral circuit region PERI may be electrically connected to upper bonding metals 371b and 372b of the cell region CELL via bonding. The lower bonding metals 271b and 272b and the upper bonding metals 371b and 372b may be formed of Al, Cu, or W. The cell contact plugs 340 may be connected to the peripheral circuit region PERI via the upper bonding metals 371b and 372b of the cell region CELL and the lower bonding metals 271b and 272b of the peripheral circuit region PERI.

The bitline bonding area BLBA may be defined as a region where channel structures CH and bitlines 360c are positioned. The bitlines 360c may be electrically connected to a fifth circuit device 220b in the bitline bonding area BLBA. For example, the bitlines 360c may be connected to upper bonding metals 371c and 372c in the peripheral circuit region PERI, and the upper bonding metals 371c and 372c may be connected to lower bonding metals 271c and 272c, which are connected to the fifth circuit device 220b.

A common source line contact plug 380 may be in the external pad bonding area PA. The common source line contact plug 380 may be formed of a conductive material, such as a metal, a metal compound, or polysilicon, and may be electrically connected to a common source line 320. First metal layers 350a and second metal layers 360a may be sequentially stacked on the common source line contact plug 380. For example, a region where the common source line contact plug 380, the first metal layers 350a, and the second metal layers 360a are located may be defined as the external pad bonding area PA. First and second input/output pads 205 and 305 may also be in the external pad bonding area PA.

Metal patterns in uppermost metal layers of the external pad bonding area PA and the bitline bonding area BLBA of the cell region CELL and the peripheral circuit region PERI may exist as dummy patterns, or the uppermost metal layers of the external pad bonding area PA and the bitline bonding area BLBA of the cell region CELL and the peripheral circuit region PERI may be empty.

In the external pad bonding area PA, lower metal patterns 271a, 272a, and 273a may be formed in the uppermost metal layer of the peripheral circuit region and in a shape a similar to upper metal patterns 371a and 372a, which are formed in the uppermost metal layer of the cell region CELL, to correspond to the upper metal patterns 371a and 372a. The lower metal patterns 271a, 272a, and 273a may not be connected to any particular contacts in the peripheral circuit region PERI. Similarly, in the external pad bonding area PA, upper metal patterns may also be formed in the uppermost metal layer of the cell region CELL and in a shape similar to lower metal patterns in the uppermost metal layer of the peripheral circuit region PERI to correspond to the lower metal patterns in the uppermost metal layer of the peripheral circuit region PERI.

In the bitline bonding area BLBA, upper metal patterns 371d and 372d may be formed in the uppermost metal layer of the cell region CELL and in a shape similar to lower metal patterns 271d and 272d, which are formed in the uppermost metal layer of the peripheral circuit region PERI, to correspond to the lower metal patterns 271d and 272d. No contacts may be formed on the upper metal patterns 371d and 372d.

An electronic system including a semiconductor memory device according to some embodiments of the present disclosure will hereinafter be described with reference to FIGS. 17 through 19.

FIG. 17 is a block diagram of an electronic system including a semiconductor memory device according to some embodiments of the present disclosure. FIG. 18 is a perspective view of an electronic system including a semiconductor memory device according to some embodiments of the present disclosure. FIG. 19 is a cross-sectional view taken along line I-I of FIG. 18.

Referring to FIG. 17, an electronic system 1000 may include a nonvolatile memory device 1100 and a controller 1200, which is electrically connected to the nonvolatile memory device 1100. The electronic system 1000 may be a storage device including at least one nonvolatile memory device 1100 or an electronic device including the storage device. For example, the electronic system 1000 may be a solid-state drive (SSD) device, a universal serial bus (USB), a computing system, a medical device, or a communication device including at least one nonvolatile memory device 1100.

The nonvolatile memory device 1100 may be a NAND flash memory device and may include, for example, the semiconductor memory device of any one of FIGS. 1 through 16. The nonvolatile memory device 1100 may communicate with the controller 1200 via input/output pads 1101, which are electrically connected to a logic circuit 1130. The input/output pads 1101 may be electrically connected to the logic circuit 1130 via input/output connection lines 1135, which extend from a first structure 1100F to a second structure 1100S. The input/output connection lines 1135 may correspond to the first or second input/output contact plug 203 or 303 of any one of FIGS. 3 through 16.

The electronic system 1000 may control first, second, and third circuit devices or pass transistor circuits 223, 224, and 233 using the controller 1200. For example, as already mentioned above, the logic circuit 1130 may be connected to the gate electrodes of the first, second, and third pass transistor circuits 223, 224, and 233. The gate electrodes of the first, second, and third pass transistor circuits 223, 224, and 233 may be controlled by the controller 1200 and may thus receive voltages.

The controller 1200 may include a processor 1210, a NAND controller 1220, and a host interface 1230. In some embodiments, the electronic system 1000 may include a plurality of nonvolatile memory devices 1100, in which case, the controller 100 may control the plurality of nonvolatile memory devices 1100.

The processor 1210 may control the general operation of the electronic system 1000 including the controller 1200. The processor 1210 may operate in accordance with predetermined firmware and may access the nonvolatile memory device(s) 1100 by controlling the NAND controller 1220. The NAND controller 1220 may include a NAND interface 1221, which processes communication with the nonvolatile memory device(s) 1100. Control commands for controlling the nonvolatile memory device(s) 1100, data to be written to memory cell transistors 1127 of the nonvolatile memory device(s) 1100, and data to be read from the memory cell transistors 1127 may be transmitted via the NAND interface 1221. The host interface 1230 may provide a communication function between the electronic system 1000 and an external host. As a control command is received from the external host via the host interface 1230, the processor 1210 may control the nonvolatile memory device(s) 1100 in response to receiving the control command.

Figure 18:
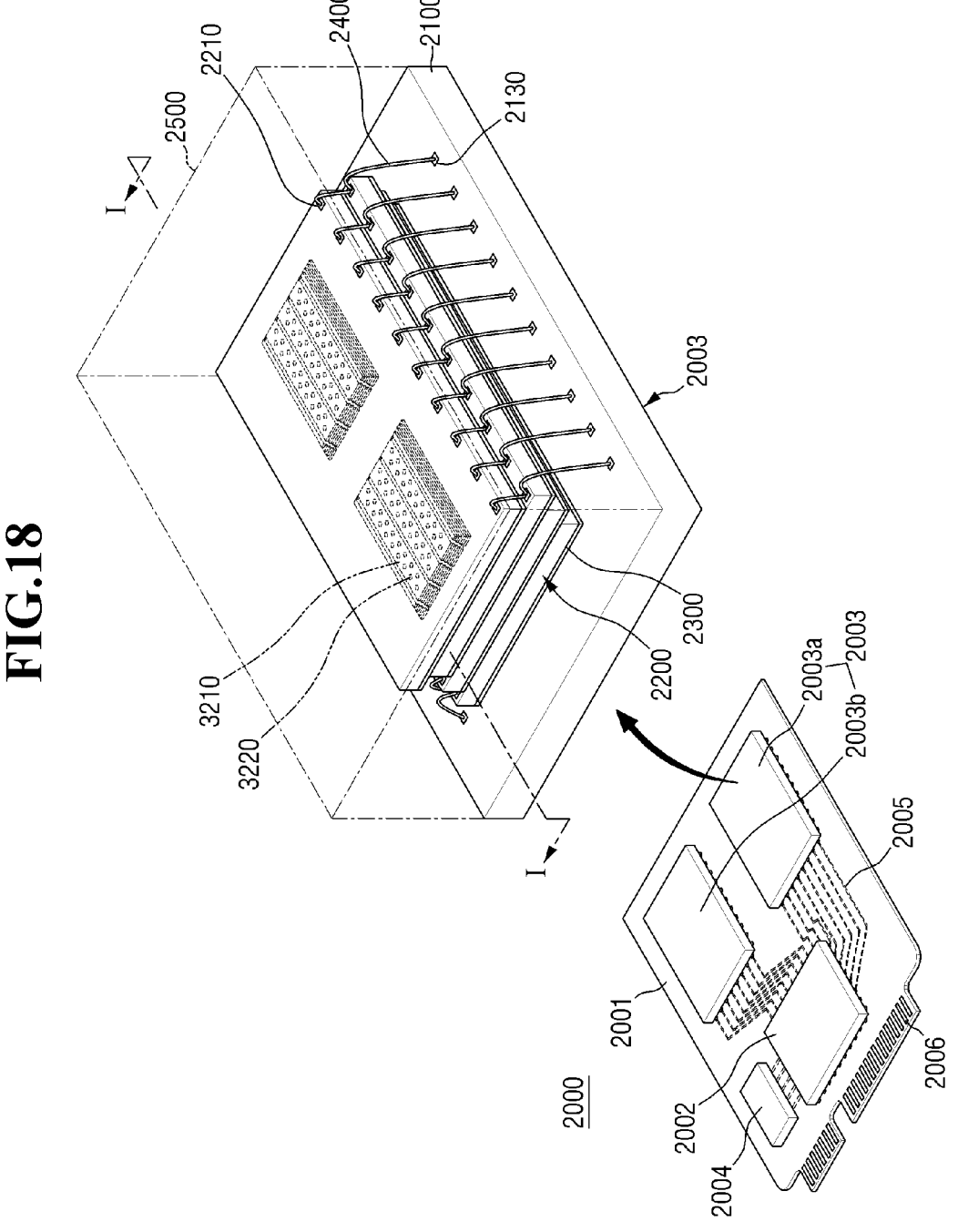
FIG. 18 is a perspective view of an electronic system including a semiconductor memory device according to some embodiments of the present disclosure.

Referring to FIG. 18, an electronic system 2000 may include a main substrate 2001, a main controller 2002, one or more semiconductor packages 2003, and a dynamic random-access memory (DRAM) 2004. The main controller 2002, the one or more semiconductor packages 2003, and the DRAM 2004 are mounted on the main substrate 2001. The semiconductor packages 2003 and the DRAM 2004 may be connected to the main controller 2002 via wiring patterns 2005.

The main substrate 2001 may include a connector 2006, which includes a plurality of pins. The number and the layout of pins of the connector 2006 may vary based on a communication interface between the electronic system 2000 and an external host. In some embodiments, the electronic system 2000 may communicate with the external host in accordance with an interface, such as USB, Peripheral Component Interconnect (PCI)-Express, Serial Advanced Technology Attachment (SATA), or M-PHY for Universal Flash Storage (UFS). In some embodiments, the electronic system 2000 may be driven by power supplied thereto from the external host via the connector 2006. The electronic system 2000 may further include a power management integrated circuit (PMIC), which divides the power from the external host between the main controller 2002 and the semiconductor packages 2003.

The main controller 2002 may write data to, or read data from, the semiconductor packages 2003 and may improve the operating speed of the electronic system 2000.

The DRAM 2004 may be a buffer memory for reducing the difference in speed between the semiconductor packages 2003, which are spaces for storing data, and the external host. The DRAM 2004, which is included in the electronic system 2000, may operate as a cache memory and may provide space for temporarily storing data during a control operation for the semiconductor packages 2003. When the DRAM 2004 is included in the electronic system 2000, the main controller 2002 may further include a DRAM controller for controlling the DRAM 2004 in addition to a NAND controller for controlling the semiconductor packages 2003.

The semiconductor packages 2003 may include first and second semiconductor packages 2003a and 2003b, which are spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200, which are on the package substrate 2100, adhesive layers 2300, which are on the bottom surfaces of the semiconductor chips 2200, connection structures 2400, which electrically connect the semiconductor chips 2200 and the package substrate 2100, and a molding layer 2500, which covers the semiconductor chips 2200 and the connection structures 2400, on the package substrate 2100.

The package substrate 2100 may be a printed circuit board (PCB) including package upper pads 2130. Each of the chips

2200 may include input/output pads 2210. The input/output pads 2210 may correspond to the input/output pads 1101 of FIG. 17. Each of the semiconductor chips 2200 may include gate stack structures 3210 and memory channel structures 3220. The gate stack structures 3210 may correspond to memory blocks, and the memory channel structures 3220 may correspond to channel structures CH. Each of the semiconductor chips 2200 may include the semiconductor memory device of any one of FIGS. 1 through 16.

In some embodiments, the connection structures 2400 may be bonding wires electrically connecting the input/output pads 2210 and the package upper pads 2130. Thus, in each of the first and second semiconductor packages 2003a and 2003b, the semiconductor chips 2200 may be electrically connected to one another and to the package upper pads 2130 via wire bonding. In some embodiments, in each of the first and second semiconductor packages 2003a and 2003b, the semiconductor chips 2200 may be electrically connected to one another by connection structures including through silicon vias (TSVs) instead of by the connection structures 2400.

In some embodiments, the main controller 2002 and the semiconductor chips 2200 may be included in a single package. In some embodiments, the main controller 2002 and the semiconductor chips 2200 may be mounted on an interposer substrate, which is different from the main substrate 2001, and the main controller 2002 and the semiconductor chips 2200 may be connected to one another by wires formed on the interposer substrate.

Figure 19:
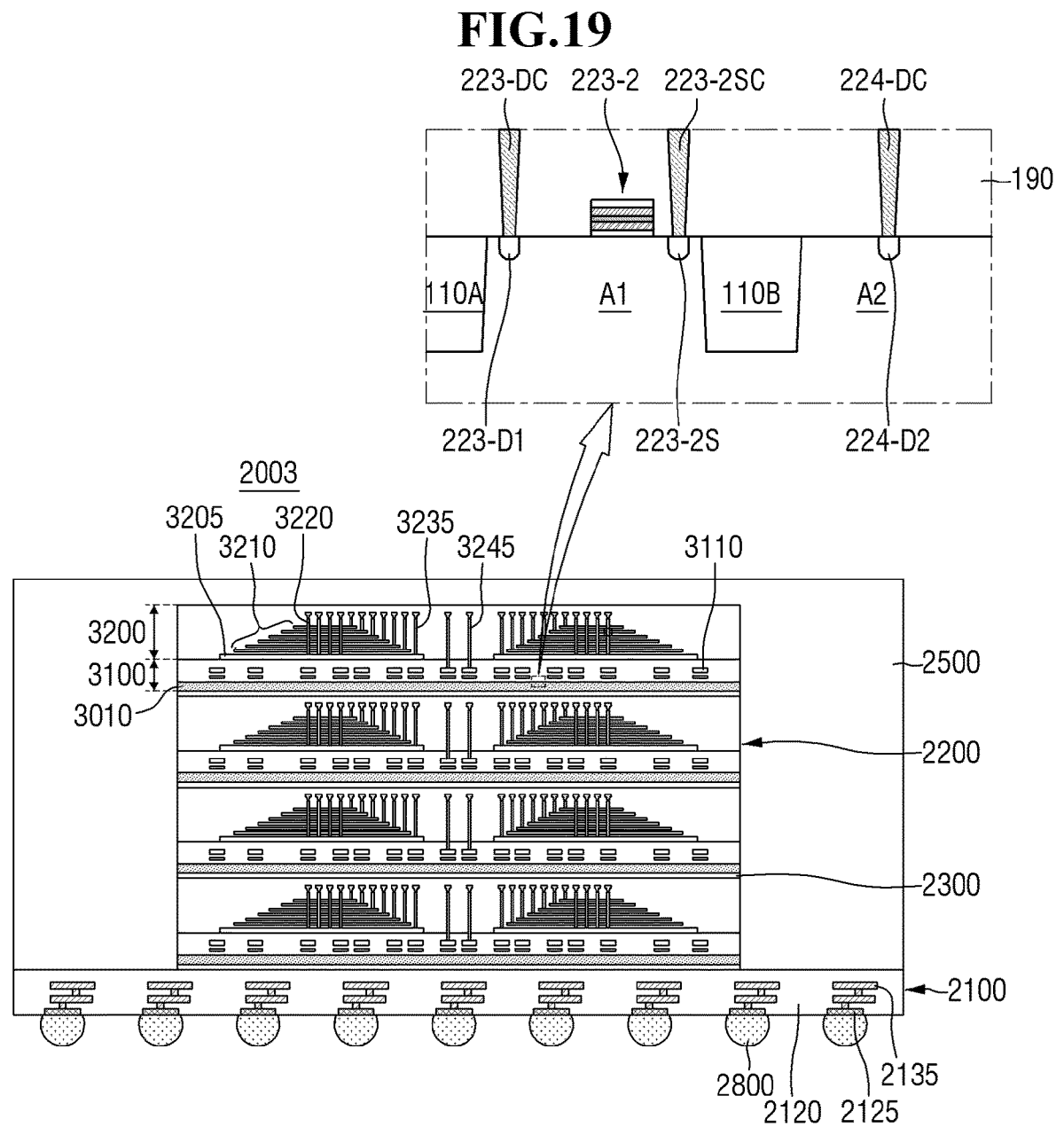

Referring to FIGS. 18 and 19, the package substrate 2100 of the semiconductor package 2003 may be a PCB. The package substrate 2100 may include a package substrate body 2120, package upper pads 2130 that are on the top surface of the package substrate body 2120, package lower pads 2125 that are on, or exposed through, the bottom surface of the package substrate body 2120, and inner wires 2135 that electrically connect the package upper pads 2130 and the package lower pads 2125 in the package substrate body 2120. The package upper pads 2130 may be electrically connected to the connection structures 2400. Referring to FIG. 18, the package lower pads 2125 may be connected to the wiring patterns 2005 of the main substrate 2001 of the electronic system 2000 via conductive connectors 2800.

Each of the semiconductor chips 2200 may include first and second structures 3100 and 3200, which are sequentially stacked. The first structure 3100 may correspond to the peripheral circuit region PERI of FIG. 13, and the second structure 3200 may correspond to the cell region CELL of FIG. 13. For example, the first structure 3100 may include a first semiconductor substrate 3010, which corresponds to the first substrate 50 of FIG. 13. The second structure 3200 may include a second semiconductor substrate 3205, which corresponds to the second substrate 310 of FIG. 13. Also, the second structure 3200 may include gate stack structures 3210 and memory channel structures 3220.

The second structure 3200 may include gate connection wires 3235. The gate connection wires 3235 may be electrically connected to the gate stack structure 3210. The gate connection wires 3235 may correspond to the cell contact plugs 340 of FIG. 13.

Each of the semiconductor chips 2200 may include through wires 3245, which are electrically connected to peripheral wires 3110 of the first structure 3100 and extend into the second structure 3200. The through wires 3245 may be on the outside of the gate stack structures 3210 and may penetrate the gate stack structures 3210. Each of the semiconductor chips 2200 may further include input/output pads

2210, which are electrically connected to the peripheral wires 3110 of the first structure 3100.

In some embodiments, the first structure 3100 may include the first active region A1, the first pass transistor circuit 223, the gate structures 223-1G, 223-2G, and 223-3G, the individual sources/drains 223-1S, 223-2S, and 223-3S, the first shared source/drain 223-D1, the individual sources/drains 223-1SC, 223-2SC, and 223-3SC, the first shared source/drain contact 223-DC, the second active region A2, the second pass transistor circuit 224, the gate structures 224-1G, 224-2G, and 224-3G, the individual sources/drains 224-1S, 224-2S, and 224-3S, the second shared source/drain 224-D2, the individual source/drain contacts 224-1SC, 224-2SC, and 224-3 SC, and the second shared source/drain contact 224-DC.

Referring to FIGS. 18 and 19, the semiconductor chips 2200 may be electrically connected to one another by the connection structures 2400, which are bonding wires. However, in some embodiments, semiconductor chips in a semiconductor package, such as the semiconductor chips 2200 of FIGS. 17 and 18, may be electrically connected to one another by connection structures, such as TSVs.

Embodiments of the present disclosure have been described above with reference to the accompanying drawings, but the present disclosure is not limited thereto and may be implemented in various different forms. It will be understood that the present disclosure can be implemented in other specific forms without changing the technical spirit or gist of the present disclosure. Therefore, it should be understood that the embodiments set forth herein are illustrative in all respects and not limiting.

What is claimed is:

1. A semiconductor memory device comprising:
a substrate including a first region and a second region, wherein:
the first region includes a peripheral circuit and a first active region (FAR);
the second region includes memory cell blocks;
the FAR includes a FAR first extension extending in a first direction, a FAR second extension extending in a second direction, and a FAR third extension extending in a third direction, and
the FAR first extension, the FAR second extension, and the FAR third extension form respective angles greater than 90 degrees relative to one another; and
a first pass transistor circuit configured to transmit driving signals such that operating voltages are applied to the memory cell blocks, wherein the first pass transistor circuit includes:
a FAR first gate structure on the FAR first extension, a FAR second gate structure on the FAR second extension, and a FAR third gate structure on the FAR third extension, and
a first shared source/drain between the FAR first gate structure, the FAR second gate structure, and the FAR third gate structure.

2. The semiconductor memory device of claim 1, wherein the memory cell blocks include a first memory cell block, a second memory cell block, a third memory cell block, and wherein the first pass transistor circuit further includes a first pass transistor, a second pass transistor, and a third pass transistor configured to transmit the driving signals such that the operating voltages are applied to the first memory cell block, the second memory cell block, and the third memory cell block, respectively.

3. The semiconductor memory device of claim 1, wherein the first pass transistor circuit further includes a first individual source/drain on the FAR first extension, a second individual source/drain on the FAR second extension, and a third individual source/drain on the FAR third extension.

4. The semiconductor memory device of claim 1, wherein the FAR is Y-shaped.

5. The semiconductor memory device of claim 1, further comprising:
a second active region (SAR) defined in the first region of the substrate and spaced apart from the FAR; and
a second pass transistor circuit in the SAR and spaced apart from the first pass transistor circuit, wherein:
the SAR includes a SAR first extension extending in the first direction, a SAR second extension extending in the second direction, and a SAR third extension extending in the third direction,
the second pass transistor circuit includes a SAR first gate structure on the SAR first extension, a SAR second gate structure on the SAR second extension, a SAR third gate structure on the SAR third extension, and a second shared source/drain between the SAR first gate structure, the SAR second gate structure, and the SAR third gate structure.

6. The semiconductor memory device of claim 5, wherein:
a center of the FAR defines a recess, and
one of the SAR first extension, the SAR second extension, and the SAR third extension corresponds to the recess.

7. The semiconductor memory device of claim 5, wherein:
the substrate extends in a first horizontal direction and a second horizontal direction that is orthogonal to the first horizontal direction, and
the first and second shared sources/drains are aligned in the first direction.

8. The semiconductor memory device of claim 5, further comprising:
a third active region (TAR) defined in the first region of the substrate and spaced apart from the FAR and the SAR; and
a third pass transistor circuit in the TAR and spaced apart from the first pass transistor circuit and the second pass transistor circuit, wherein:
the TAR includes a TAR first extension extending in the first direction, a TAR second extension extending in the second direction, and a TAR third extension extending in the third direction, and
the third pass transistor circuit includes a TAR first gate structure on the TAR first extension, a TAR second gate structure on the TAR second extension, and a TAR third gate structure on the TAR third extension, and a third shared source/drain.

9. The semiconductor memory device of claim 8, wherein the FAR and the SAR are in a Y shape and have a side-by-side arrangement,
the FAR and the TAR are in the Y shape and have the side-by-side arrangement, and
a distance between the first shared source/drain and the second shared source/drain, a distance between the second shared source/drain and the third shared source/drain, and a distance between the first shared source/drain and the third shared source/drain are equal.

10. The semiconductor memory device of claim 8, wherein
the FAR and the SAR are in a Y shape and have an inverted arrangement,
the FAR and the TAR are in the Y shape and have the inverted arrangement, and a distance between the first shared source/drain and the second shared source/drain and a distance between the first shared source/drain and the third shared source/drain are equal.

11. The semiconductor memory device of claim 8, further comprising:

a fourth active region (FoAR) defined in the first region of the substrate and spaced apart from the FAR, the SAR, and the TAR; and a fourth pass transistor circuit in the FoAR and spaced apart from the first pass transistor circuit, the second pass transistor circuit, and the third pass transistor circuit, wherein:

the FoAR includes a FoAR first extension extending in the first direction, a FoAR second extension extending in the second direction, and a FoAR third extension extending in the third direction, and the fourth pass transistor circuit includes a FoAR first gate structure on the FoAR first extension, a FoAR second gate structure on the FoAR second extension, and a FoAR third gate structure on the FoAR third extension, and a fourth shared source/drain.

12. The semiconductor memory device of claim 11, wherein the FAR and the SAR are in a Y shape and have a side-by-side arrangement, the FAR and the FoAR are in the Y shape and have the side-by-side arrangement, a first distance between the first shared source/drain and the second shared source/drain and a second distance between the first shared source/drain and the fourth shared source/drain are equal, and a third distance between the first shared source/drain and the third shared source/drain is different from the first distance or the second distance.

13. The semiconductor memory device of claim 11, wherein the FAR and the SAR are in a Y shape and have an inverted arrangement, the TAR and the FoAR are in the Y shape and have the inverted arrangement, the SAR and the TAR are in the Y shape and have a side-by-side arrangement, the FAR and the FoAR are in the Y shape and have the side-by-side arrangement, and a distance between the first shared source/drain and the second shared source/drain, a distance between the second shared source/drain and the third shared source/drain, a distance between the third shared source/drain and the fourth shared source/drain, and a distance between the first shared source/drain and the fourth shared source/drain are equal.

14. A semiconductor memory device comprising:

a first substrate including a first surface that extends in a first horizontal direction and a second horizontal direction that is orthogonal to the first horizontal direction, and a memory cell region on the first surface; and a second substrate including a second surface that is below the first substrate, a first peripheral circuit region on the second surface and configured to receive a block selection signal and to transmit a driving signal to the memory cell region, wherein the first peripheral circuit region includes a first active region, the first active region including a first gate structure extending in a first direction, a second gate structure extending in a second direction, a third gate structure extending in a third direction, and a first shared drain between the first gate structure, the second gate structure, and the third gate structure, and wherein the first direction, the second direction, and the third direction are not parallel to one another and are spaced apart from one another.

15. The semiconductor memory device of claim 14, wherein the first active region includes a first extension, a second extension, and a third extension that form respective angles of 120 degrees relative to one another.

16. The semiconductor memory device of claim 14, wherein the first peripheral circuit region and the memory cell region are connected by bonding first bonding pads on the first substrate and second bonding pads on the second substrate, and wherein the first surface of the first substrate and the second surface of the second substrate face each other.

17. The semiconductor memory device of claim 14, wherein:

the memory cell region includes gate electrode layers that extend in the first horizontal direction and are stacked in a vertical direction, and the memory cell region includes channel structures that extend in the vertical direction and penetrate the gate electrode layers, and each of the channel structures includes an information storage film, a semiconductor pattern, and a variable resistance film that are sequentially stacked on sidewalls of channel holes that penetrate the gate electrode layers.

18. The semiconductor memory device of claim 17, wherein:

a second peripheral circuit region is on the second substrate and is spaced apart from the first peripheral circuit region, the second peripheral circuit region includes a second active region, the second active region including a fourth gate structure extending in the first direction, a fifth gate structure extending in the second direction, and a sixth gate structure extending in the third direction, the fourth gate structure, the fifth gate structure, and the sixth gate structure spaced apart from one another, a second shared drain between the fourth gate structure, the fifth gate structure, and the sixth gate structure and the first and second shared drains are aligned in the first direction.

19. The semiconductor memory device of claim 18, wherein the first active region and the second active region are in a Y shape and have a side-by-side arrangement.

20. An electronic system comprising:

a main substrate;

a semiconductor memory device on the main substrate, the semiconductor memory device including a first substrate that includes a peripheral circuit and a second substrate that includes memory cells; and a controller on the main substrate, the controller being electrically connected to the semiconductor memory device, wherein:

the semiconductor memory device includes an active region that is defined on the first substrate, the active region includes a first extension extending in a first direction, a second extension extending in a second direction, and a third extension extending in a third direction, the first extension, the second extension, and the third extension forming respective angles greater than 90 degrees relative to one another, the active region includes a pass transistor circuit configured to transmit driving signals such that operating voltages are applied to the memory cells, and the pass transistor circuit includes a first gate structure on the first extension, a second gate structure on the second extension, a third gate structure on the third extension, and a shared source/drain between the first gate structure, the second gate structure, and the third gate structure.

*  *  *  *  *